United States Patent [19]

Ipposhi et al.

[11] Patent Number: 5,528,054
[45] Date of Patent: Jun. 18, 1996

[54] SEMICONDUCTOR DEVICE HAVING ACTIVE REGION IN SEMICONDUCTOR LAYER ON INSULATOR LAYER AND MANUFACTURING METHOD THEREOF

[75] Inventors: Takashi Ipposhi; Kazuyuki Sugahara, both of Hyogo, Japan

[73] Assignee: Mitsubishi Denki Kabushiki Kaisha, Tokyo, Japan

[21] Appl. No.: 416,110

[22] Filed: Apr. 3, 1995

Related U.S. Application Data

[63] Continuation of Ser. No. 200,871, Feb. 22, 1994, abandoned, which is a continuation of Ser. No. 950,364, Sep. 24, 1992, abandoned.

[30] Foreign Application Priority Data

Oct. 17, 1991 [JP] Japan .................................. 3-269396
Jun. 1, 1992 [JP] Japan .................................. 4-140800

[51] Int. Cl.⁶ .......................... H01L 29/78; H01L 29/04
[52] U.S. Cl. ........................... 257/66; 257/75; 257/369
[58] Field of Search ................................ 257/57, 66, 75

[56] References Cited

U.S. PATENT DOCUMENTS

| | | | |
|---|---|---|---|
| 4,514,895 | 5/1985 | Nishimura | 257/57 |
| 4,543,133 | 9/1985 | Mukai | 257/75 |
| 4,822,752 | 4/1989 | Sugahara et al. | |
| 5,028,564 | 7/1991 | Chang et al. | |
| 5,039,621 | 8/1991 | Pollack | |

FOREIGN PATENT DOCUMENTS

| | | |
|---|---|---|
| 0179719A1 | 4/1986 | European Pat. Off. |
| 0194495 | 9/1986 | European Pat. Off. |
| WO-A-86/02198 | 4/1986 | WIPO |

OTHER PUBLICATIONS

Sugahara et al. "Orientation Control of SOI Film By Laser Recrystallization" 18th (1986 International) Conference Solid State Devices, Tokyo, 1986, pp. 65–568.
Sugahara et al. "Orientation Control of the Silicon Film on Insulator by Laser Recrystallization" J. Appl. Physics, vol. 62 (15 Nov. 1987) pp. 4178–4181.
JP-OS 3-96216 (A) in: Patents Abstracts of Japan, E-1090, vol. 15, No. 280, Jul. 16, 1991.
"Evaluation and Control of Grain Boundaries in Laser-Recrystallized Polysilicon Islands for Device Fabrication" by Tadashi Nishimura et al., Proceedings of the 14th Conference on Solid State Devices, Tokyo, 1982; Japanese Journal of Applied Physics, vol. 22 (1983) Supplement 22-1, pp. 217–221.
"Effect of Grain Boundaries on the I–V Characteristic of P–Channel MOSFET/SOI" by T. Nishimura et al., Extended Abstracts of the 17th Conference on Solid State Devices and Materials, Tokyo, 985, pp. 147–150.

(List continued on next page.)

*Primary Examiner*—Gene M. Munson
*Attorney, Agent, or Firm*—Lowe, Price, LeBlanc & Becker

[57] ABSTRACT

Generation of new crystal defects in a monocrystalline semiconductor layer caused by heat treatment, oxidation treatment or polishing treatment is prevented in a method of manufacturing a semiconductor device of an SOI structure. Thus, unevenness in the properties of active devices formed on the monocrystalline semiconductor layers and their malfunctions can be restrained. A non-monocrystalline semiconductor layer formed on an insulator layer is melted to have a prescribed temperature distribution, and monocrystallized. The region of the obtained monocrystalline semiconductor layer corresponding to a high temperature portion in melting is selectively removed before the monocrystalline semiconductor layer is subjected to heat-treatment. Active devices are formed on the resultant island shaped monocrystalline semiconductor layers. The surface of the island shaped monocrystalline semiconductor layer may be polished to be planarized before the formation of the active device.

8 Claims, 25 Drawing Sheets

OTHER PUBLICATIONS

"SOI/SOI/Bulk–Si Triple–Level Structure for Three–Dimensional Devices", by K. Sugahara et al., IEEE Electron Device Letters, vol. EDL–7, No. 3, Mar. 1986, pp. 193–195.

Electronics. DE 184 A 1985: Electronics Week, vol. 56, No. 9, May 1983, New Yor, US, pp. 86–86, R. T. Gallagher, "Silicon On Insulator Attains High Yield By Boundary Control".

Microelectronic Engineering., vol. 8, No. 3–4, Dec. 1988, Amsterdam NL, pp. 273–291, E. I. Givcargizov et al., "Artificial Epitaxy (Graphoepitaxy) As An Approach To The Formation Of SOI", p. 273, line 1–p. 275, line 3; FIG. 2,12.

SEMICONDUCTOR DEVICE HAVING ACTIVE REGION IN SEMICONDUCTOR LAYER ON INSULATOR LAYER AND MANUFACTURING METHOD THEREOF

This application is continuation of application Ser. No. 08/200,871 filed Feb. 22, 1994 which is a continuation of application Ser. No. 07/950,364, filed Sep. 24, 1992, both now abandoned.

BACKGROUND OF THE INVENTION

1. Field of the Invention

The present invention relates to a semiconductor device and a manufacturing method thereof, and more specifically to a semiconductor device having an active region in a semiconductor layer formed on an insulator layer and a manufacturing method thereof.

2. Description of the Background Art

In the field of semiconductor device manufacture, an integrated circuit aimed at increasing integration density or improving functions by stacking active devices in a three-dimensional manner is a so-called three-dimensional integrated circuit. In implementation of such a three-dimensional integrated circuit, a technique for forming a so-called SOI (Silicon On Insulator) structure in which a monocrystalline semiconductor layer is formed on an insulator layer plays a significant role.

A number of methods for forming a monocrystalline silicon layer on an insulator layer have been proposed, such as a method of forming an oxide film in a substrate by implanting oxygen ions into a monocrystalline silicon substrate (SIMOX), melt recrystallization method by which a non-monocrystalline semiconductor on an insulator layer is heated by a heater, melt recrystallization method by means of energy beam irradiation, etc. Especially, the melt recrystallization by energy beam irradiation is indispensable for forming a three-dimensional integrated circuit device. The three-dimensional integrated circuit device is an integrated circuit which is formed into a multilayer structure by stacking integrated circuit layers with an insulator layer therebetween, which is conventionally a single layer, and aimed at great improvements in function and integration density compared to conventional two-dimensional integrated circuit devices.

The melt recrystallization method is a method of forming a monocrystalline layer by recrystallizing a polycrystalline or amorphous semiconductor layer on an insulator layer by means of heat-treatment. A high power laser or an electron beam may be used for the energy beam, but the laser is mainly used as it is easier to operate. The temperature distribution inside a molten semiconductor should be controlled so that recrystallization is initiated from an arbitrary location in order to form a monocrystalline semiconductor layer by the melt recrystallization method by means of laser irradiation. A number of methods have been suggested for controlling the distribution of temperature, and in any method, recrystallization starts from a position of low temperature and proceeds toward high temperature locations. This results in the formation of sub-grain boundaries or grain boundaries after the high temperature locations are recrystallized. A melt recrystallization method by means of laser irradiation using an anti reflection film for controlling the temperature is described in detail, for example, in U.S. Pat. No. 4,822,752. A description will be provided on how a monocrystalline semiconductor layer is formed by such a melt recrystallization method by means of laser irradiation using an anti reflection film.

FIG. 42 is a sectional perspective view showing a structure of a semiconductor device in a manufacturing process in accordance with a conventional melt recrystallization method by laser irradiation. FIGS. 43 to 45 are sectional views showing structures for illustrating the essential steps of the melt recrystallization method. The melt recrystallization method which will be described in the following is a method using an anti reflection film for the purpose of arbitrarily controlling the temperature distribution in a molten semiconductor layer.

Referring to FIGS. 42 and 43, an insulating layer 2 formed of a silicon oxide film is formed on the surface of a silicon monocrystalline substrate 1. An opening 15 is formed in a prescribed region of insulating layer 2. Opening 15 constitutes a seed portion. A non-monocrystalline semiconductor layer, in other words a polycrystalline silicon layer 13 is formed on the surface of insulating layer 2 and inside opening 15. Anti reflection films 14 of a prescribed shape are also formed on the surface of polycrystalline silicon layer 13. A silicon nitride film ($Si_3N_4$) is for example used for anti reflection film 14. Anti reflection films 14 are each formed at a position an approximately equal distance separated from opening 15 formed in insulating layer 2 (see FIG. 42). Though not shown, a thin cap film may be formed entirely over the surfaces of polycrystalline silicon layer 13 and anti reflection film 14 for the purpose of keeping the surfaces from deforming in the process of recrystallization. Opening 15 is filled with polysilicon which is a non-monocrystalline semiconductor. The crystalline orientation of polycrystalline silicon layer 13 to be recrystallized is therefore controlled based on silicon monocrystalline substrate 1.

The reflectivity of a silicon nitride film forming anti reflection film 14 periodically indicates the maximum value and 0 depending upon its thickness. Taking advantage of this effect, a silicon nitride film having a thickness giving a reflectivity of 0 is used for the anti reflection film. According to this conventional example, silicon oxide film having a thickness of about 600 Å (60 nm) is used for anti reflection film 14. Therefore, in FIGS. 42 and 43, anti reflection films 14 selectively formed on the surface of polycrystalline silicon layer 13 has zero reflectivity to laser light 70, in other words absorbs almost all the incident light. In contrast, the region in which the thickness of anti reflection film is 0, in other words the region in which the surface of polycrystalline silicon layer 13 is exposed has a reflectivity of about 40% to the laser light 70. This causes the laser light irradiated upon the entire surface of polycrystalline silicon layer 13 to be more absorbed at the lower portion of anti reflection film 14, and the region is heated to a higher temperature. The laser light 70 used has a wave length of about 488 nm, and a beam diameter in the range of about 120–180 μm. A silicon oxide film having a thickness in the range between 1–3 μm is used for insulating layer 2, and polycrystalline silicon layer 13 used as the non-monocrystalline semiconductor layer has a thickness of about 0.6 μm. The width of anti reflection film 14 is about 5 μm, and the spacing between the films is about 10 μm.

Laser light 70 moves at a constant speed while being irradiated upon the surface of polycrystalline silicon layer 13. Polycrystalline silicon layer 13 irradiated with the laser light 70 has its temperature increased, and melts. The temperature distribution of polycrystalline silicon layer 13 at that time is shown in FIG. 46. FIG. 46 is a representation showing the temperature distribution for illustrating the relation between positions on the surface of polycrystalline silicon layer 13 and inside temperatures. As can be seen from the illustrated temperature distribution, the inside temperature of polycrystalline silicon layer 13 is higher at the lower portion of anti reflection film 14. In other words, the inside temperature of polycrystalline silicon layer 13 is lower in the vicinity of opening 15.

Referring to FIG. 44, after the passage of the laser light 70, melted polycrystalline silicon layer 13 is cooled, has its temperature gradually decreased, and starts recrystallizing (solidifying) from the region of lower temperatures. As shown in the temperature distribution of FIG. 46, the inside temperature of polycrystalline silicon layer 13 is low in the vicinity of opening 15, and in the cooling process recrystallization of polycrystalline silicon layer 13 is initiated using as a seed portion 16 polycrystalline silicon layer 13 which fills opening 15. Seed portion 16 is connected to silicon monocrystalline substrate 1. Therefore, a monocrystalline silicon region 3a having the same crystal orientation as silicon monocrystalline substrate 1 expands from seed portion 16 toward the circumference thereof.

Referring to FIG. 45, the polycrystalline silicon layer completely recrystallized changes into a homogenous monocrystalline silicon layer 3. Anti reflection films 14 are then removed away.

When a monocrystalline semiconductor layer is formed in such a way, the lower portion of the anti reflection film has a higher temperature, and, therefore, recrystallization of the polycrystalline silicon layer starts from the seed portions between the anti reflection films and proceeds toward the lower portions of the anti reflection films. This results in the collision of crystals developed from the opposing sides of the anti reflection film. Sub-grain boundaries 31 emerge at the positions where the developed crystals collide against each other (see FIG. 45).

Although each semiconductor layer portion between anti reflection films is monocrystalline, their crystalline orientations are, to be exact, slightly shifted from each other because adjacent semiconductor layers with anti reflection films therebetween separately grow into crystal. Sub-grain boundaries 31 are formed as the boundary portion. Such sub-grain boundaries 31 emerge under the anti reflection films, and, therefore, their positions can be controlled. Even when recrystallization is conducted without forming the seed portions (openings), the semiconductor layer portions between anti reflection films are formed into monocrystal. However, since nothing defines the orientation of the monocrystal in this case, the adjacent semiconductor layers with the anti reflection films therebetween have different crystal orientations. More specifically, the boundaries under the anti reflection films are formed as grain boundaries.

Effects given by such grain boundaries or sub-grain boundaries on the properties of active devices formed in a monocrystalline silicon layer are reported in Japanese Journal of Applied Physics Vol. 22, 1983, Supplement 22-1 pp. 217–221, or Extended Abstracts of the 17th Conference on Solid State Devices and Materials, Tokyo, 1985, pp. 147–150. According to the documents, increase of current leakage, etc. are induced in the presence of grain boundaries in the channel region of an MOS field effect transistor. The active region of a transistor is therefore defined so as to exclude the existence of grain boundaries or sub-grain boundaries in the channel region of an MOS field effect transistor according to a prior art technique disclosed in IEEE Electron Device Letter, Vol. EDL-7, No. 3, March 1986, pp. 193–195. More specifically, as will be described later, a silicon nitride film 181 is patterned so as to exclude a region of sub-grain boundaries 31 in a monocrystalline silicon layer 3 as shown in FIG. 50. An active region is formed in a region of monocrystalline silicon layer 3 which is free of the sub-grain boundaries under silicon nitride film 181.

It has been established that the presence of sub-grain boundaries or grain boundaries do not give any adverse effect on the properties of active devices even with sub-grain boundaries or grain boundaries existing other than in a channel region, for example, in a source/drain region, because the source/drain region containing an impurity of high concentration has its resistance reduced, provided that sub-grain boundaries or grain boundaries do not exist at the pn junction.

The surface of monocrystalline silicon layer 3 formed by a melt recrystallization method using such an anti reflection film as described above waves and is roughly stepped as shown in FIG. 45. FIG. 47 is a graphic representation showing the result of the measurement as to the surface roughness of monocrystalline silicon layer 3 shown in FIG. 45. The measurement represents the case in which the thickness of a recrystallized semiconductor layer is 550 nm. In this case, the steps and recesses formed on the surface is each as large as about ±60 nm (0.06 µm) or more. The surface of recrystallized monocrystalline silicon layer 3 waves and is stepped because the surface of molten polycrystalline silicon layer 13 is partially covered with anti reflection films 14. More specifically, when polycrystalline silicon layer 13 is recrystallized, the layer underlying anti reflection film 14 has a higher temperature than the region between anti reflection films 14. Therefore, the region between anti reflection films 14 solidifies first and the lower portion of anti reflection films 14 later. The higher the temperature of the melt, the lower its surface tension gets, and, therefore, portion 3a to solidify first takes a stepped form, while portion 3b to solidify later takes a recessed form in the solidification of monocrystalline silicon layer 3 as shown in FIG. 45. In the surface of monocrystalline silicon layer 3, steps and recesses are produced in correspondence to the positions of anti reflection films 14 as shown in FIG. 45. The width of anti reflection film 14 is about 5 µm, with the spacing between the films being about 10 µm, the recess or step exists about for every 15 µm. The formation of such recesses and steps on the surface gives rise to various problems in the process of forming active devices on the surface of monocrystalline silicon layer 3, thus resulting in uneven performances achieved by devices.

It is known that in forming devices on such a monocrystalline semiconductor layer on an insulator layer, reducing the thickness of the semiconductor layer to 0.1 µm or smaller improves the performances of the devices. The film thickness however can not be reduced in the presence of the steps and recesses on the surface of the monocrystalline semiconductor layer as described above.

Polishing the surface of the monocrystalline semiconductor layer can be taken as an approach for reducing the steps and recesses of the surfaces as stated above, especially, a so-called rigid polishing method using a hard body such as $SiO_2$ as a surface plate instead of a polishing pad is most prevailing among various methods of reducing surface steps and recesses. When a monocrystalline semiconductor layer was polished by this rigid polishing method it was confirmed by optical microscopic and scanning electron microscopic observations that the steps and recesses of the surface of the monocrystalline semiconductor layer are each reduced to as large as several tens Å and smaller and takes a form of mirror surface.

However, even when active devices are formed in a monocrystalline semiconductor layer so that grain boundaries or sub-grain boundaries do not exist in the active region as described above, the properties of the active devices are still significantly uneven. Inspections were therefore made as to the crystal property of a monocrystalline semiconductor layer after usual process of forming active devices, and the inventors found new defects in the crystal which was not discovered immediately after the formation of the monocrystalline semiconductor layer.

FIGS. 48–58 are partially sectional views showing steps in their order in a method of manufacturing a CMOS transistor using a conventional SOI structure. Referring to these figures, a description will be provided on a method of forming an MOS transistor utilizing a conventional SOI structure and associated problems.

Referring to FIG. 48, the state of a monocrystalline semiconductor layer of SOI structure immediately after its formation is shown. An insulating layer 2 of $SiO_2$ is formed on a silicon monocrystalline substrate 1. A monocrystalline silicon layer 3 is formed on insulating layer 2. Sub-grain boundaries 31 exist at constant intervals as described above on monocrystalline silicon layer 3.

Referring to FIG. 49, an underlying oxide film 17 is formed on monocrystalline silicon layer 3 by means of heat oxidation. Underlying oxide film 17 is formed for the purpose of removing the surface defects of monocrystalline silicon layer 3. Underlaying oxide film 17 is also used as an underlying oxide film in forming element isolation regions in a subsequent step. A silicon nitride film 18 is then formed on the entire surface of underlying oxide film 17 by means of CVD (Chemical Vapor Deposition). The thicknesses of underlying oxide film 17 and silicon nitride film 18 are 500 Å and 1000 Å, respectively.

Referring to FIG. 50, a resist film 45 is formed only on the element formation region using a photolithography technique. The silicon nitride film is removed using a patterned resist film 45 as a mask, leaving a silicon nitride film 181 in place.

Referring to FIG. 51, a resist film 42 is formed in a pMOS transistor formation region. Using resist films 42 and 45 as masks, boron (B) ions are implanted into monocrystalline silicon layer 3 through underlying oxide film 17. The amount of boron implanted at this time is about $3 \times 10^{13}$ $cm^{-2}$.

Referring to FIG. 52, after removal of resist films 42 and 45, a thick oxide film 171 is formed by heat-oxidation using silicon nitride film 181 as a mask. At that time, a $p^+$ impurity region 33 is formed as a channel cut layer in the region in which the boron is implanted.

As shown in FIG. 53, after removal of silicon nitride film 181, a resist film 4 is formed only in the region for forming a pMOS transistor. Using resist film 4 as a mask boron ions are implanted into monocrystalline silicon layer 39 in the region for forming an nMOS transistor.

A $p^-$ region 34 is thus formed as shown in FIG. 54. Then, using as a mask resist film 4 formed only in the nMOS transistor formation region, phosphorus (P) ions are implanted into monocrystalline silicon layer 39 in the pMOS transistor formation region. The amounts of boron and phosphorus to be implanted at that time are determined depending upon threshold voltages set for nMOS and pMOS transistors, respectively.

An $n^-$ region 35 is formed as shown in FIG. 55. After removal of resist film 4, underlying oxide film 17 is removed away. A gate oxide film 51 is then formed. The thickness of the gate oxide film is several hundred Å. A polycrystalline silicon layer for a gate electrode as thick as about 3000 Å is formed on the entire surface by CVD method. The polycrystalline silicon layer is doped with an impurity for reducing its resistance, and then the polycrystalline layer is selectively removed away using a patterned resist film 44 as a mask. A gate electrode 61 is thus formed.

As shown in FIG. 56, a resist film 42 is formed only in the PMOS transistor formation region. Using resist films 42 and 44 as masks, arsenic (As) ions are implanted into the source and drain formation region of an NMOS transistor.

In addition, as shown in FIG. 57, a resist film 4 is formed only in the region of NMOS transistor in which an $n^+$ impurity region 36 as a source and drain region is formed. Using resist film 4 as a mask, Boron (B) ions are implanted into the source/drain formation region of a PMOS transistor.

Finally, as shown in FIG. 58, a $p^+$ impurity region 37 is formed as a source/drain region. After removal of resist film 4, an interlayer insulating film 7 is formed on the entire surface. After interlayer insulating film 7 is provided with contact holes, a metal interconnection layer 8 to be electrically in contact with each source and drain region. In a device of SOI structure, a so-called multi layer interconnection structure is usually formed by providing additional insulator layers and interconnection layers.

A method of forming a semiconductor device having a conventional SOI structure has been described, and the result of inspection as to the crystal property of SOI in this manufacturing process is schematically illustrated in FIGS. 59 and 60. FIG. 59 illustrates the result of invertors' observation on the surface of monocrystalline silicon layer 3 in the process shown in FIG. 48. As described above, other crystal defects are scarcely observed except for the existence of sub-grain boundaries 31 with its positions controlled to be under the anti reflection films. The density of crystal defect is equal to or smaller than $10^4$ $cm^{-2}$, which is about the same as a silicon monocrystalline substrate of a usual bulk. Meanwhile, FIG. 60 illustrates the result of observation on the surface of monocrystalline silicon layer 3 immediately after underlying oxide film 17 is formed on monocrystalline silicon layer 3 in the process shown in FIG. 49. According to FIG. 60, a number of crystal defects 19 extending in a certain direction starting from the sub-grain boundaries 31 are newly generated.

The inventors discovered that such new crystal defects are generated both when heat-treatment (annealing in an non-oxide atmosphere) immediately after the formation of a monocrystalline silicon layer and when the monocrystalline silicon layer is oxidized starting from sub-grain boundaries or grain boundaries. The defects are as shown in FIG. 60 generated along the direction <110> (or the direction <111>). It was demonstrated that more defects are generated when the monocrystalline silicon layer is oxidized than heat-treated. The defect is produced in a form of line as shown in FIG. 60. The density of defect is about $3 \times 10$ $cm^{-2}$ in the case of the layer subjected to oxidation, and $10^{-4}$ $cm^{-2}$ in the case of the layer subjected only to heat-treatment. This indicates that the new crystal defects result from the movement of point defects such as excess silicon or empty lattices existing in the grain boundaries or sub-grain boundaries immediately after the formation of monocrystalline silicon layer in association with stresses given in oxidation or annealing process (the defects which exist as point defects or forms planes to be layered dislocation defects). Emergence of such crystal defects would cause the properties of the active devices to be significantly uneven. For example, the threshold voltage (Vth) or current driving capability, etc. of an MOS transistor would be increased by the existence of the crystal defects. With such defect being produced crossing the channel region, an impurity diffuses along the defect, resulting in an critical defect of source-drain conduction, thus causing malfunction of the MOS transistor. It is therefore necessary to prevent such defects from being produced in order to achieve higher performances by active devices of SOI structure.

(A), (B), and (C) in FIG. 61 are plan views corresponding to FIGS. 49, 52, and 58, respectively. FIGS. 49, 52, and 58 show cross sections taken along lines X—X in (A), (B) and (C) in FIG. 61, respectively. As shown in (A) in FIG. 61, it is observed that a large number of crystal defects 19 are newly generated extending along a fixed direction starting from the sub-grain boundaries 31. Thereafter, when a thick isolation oxide film 171 is formed in a region surrounding a monocrystalline silicon layer 39 in an MOS transistor formation region shown in (B) in FIG. 61, the sub-grain boundaries are absorbed into the isolation oxide film. However, the crystal defects 19 increase by thermal treatment thereof, and remain within the monocrystalline silicon layer 39 in the MOS transistor formation region. Finally, after a gate electrode 61 is formed, and an $n^+$ impurity region 36 and a $p^+$ impurity region 37 are formed as source/drain regions, the crystal defects 19 remain extending in the source/drain regions and the channel region.

Furthermore, the inventors found that when monocrystalline silicon layer 3 is polished for reducing the steps and recesses on its surface immediately after monocrystalline silicon layer 3 is formed as shown in FIG. 48, new crystal defects 19 are produced with sub-grain boundaries 31 as the starting point as similar to the one shown in FIG. 60. These defects are not observed before polishing the surface of the monocrystalline silicon layer, and, therefore, they would be formed in the polishing step. The defects not only increase the unevenness in the device properties such as current driving capability, threshold voltage, etc. but also causes a critical defect such as increase of current leakage.

As described above, the crystal defects produced extended from the sub-grain boundaries remaining in the semiconductor device of an SOI structure will give the following effects. For example, when integrated memory cells are formed in the semiconductor device of the SOI structure, all the memory cells cannot satisfy the same characteristic. The operating speeds of all the memory cells are not uniform, and there exist memory cells having low operation speeds out of the specification. This degrades the manufacturing yield for the semiconductor devices.

For example, if the device is a memory for use in a computer, because of the differences in characteristics of the various transistors it becomes impossible to accurately read stored data from the memory. To the extent that the memory cells are functional, performance is low and operating speed of products using such devices is slow.

SUMMARY OF THE INVENTION

It is an object of the present invention to restrain unevenness in the properties of active elements formed in a monocrystalline semiconductor layer in a semiconductor device of SOI structure.

Another object of the present invention is to restrain the malfunctioning of active elements formed in a monocrystalline semiconductor layer from taking place in a semiconductor device of SOI structure.

Yet another object of the present invention is to restrain unevenness in threshold voltages and current driving forces of MOS transistors formed in a monocrystalline semiconductor layer in a semiconductor device of SOI structure.

A still further object of the present invention is to restrain leakage current in MOS transistors formed in a monocrystalline semiconductor layer from increasing in a semiconductor device of SOI structure.

A still further object of the present invention is to restrain crystal defects in a monocrystalline semiconductor layer from being produced in a method of manufacturing a semiconductor device of SOI structure.

A still further object of the present invention is to improve the manufacturing yield of semiconductor devices of an SOI structure.

A semiconductor device in accordance with one aspect of the present invention is a semiconductor device having a recrystallized silicon layer, and includes an insulator layer, a monocrystalline silicon island, and a transistor. The monocrystalline silicon island is formed on a surface of the insulator layer and free of any sub-grain boundary. The transistor includes a region formed in the monocrystalline silicon island.

A method of manufacturing a semiconductor device in accordance with another aspect of the present invention is a method of manufacturing a semiconductor device including an active region in a semiconductor layer formed on an insulator layer. The non-monocrystalline semiconductor layer is melted by heating to have a prescribed temperature distribution, and changed into a monocrystalline semiconductor layer. A part of the monocrystalline semiconductor layer corresponding to the high temperature portion of the temperature distribution in melting is selectively removed away, and an island shaped monocrystalline semiconductor layer is formed. The island shaped monocrystalline semiconductor layer is treated, and an active device is formed in the island shaped monocrystalline semiconductor layer.

In the semiconductor device according to the present invention, a transistor region is formed in the monocrystalline silicon island which is free of sub-grain boundaries. Therefore, no crystal defect due to sub-grain boundary exist in the transistor region. Consequently, unevenness in the characteristics of transistors formed in the monocrystalline silicon island can be suppressed.

Further, in the method of manufacturing the semiconductor device according to the present invention, the active device is formed in the island shaped monocrystalline semiconductor layer, and, therefore, a part of the monocrystalline semiconductor layer corresponding to a high temperature portion in a temperature distribution in melting is selectively removed away before the island shaped monocrystalline semiconductor layer is subjected to a prescribed treatment. For example, before the monocrystalline semiconductor layer is subjected to heat treatment or the surface layer of the monocrystalline semiconductor layer is subjected to polishing, a region of the monocrystalline semiconductor layer corresponding to the high temperature portion in the temperature distribution at the time of melting is removed away. This region of the monocrystalline semiconductor layer corresponding to the high temperature portion in the temperature distribution in melting corresponds to the region in which sub-grain boundaries or grain-boundaries exist. Therefore, after the region in which sub-grain boundaries or grain-boundaries exist is previously removed away, an active device is formed in the island shaped monocrystalline semiconductor layer. Therefore, new crystal defects caused by the existence of sub-grain boundaries or grain boundaries created in the course of the heat treatment or polishing treatment will not be produced. As a result, the characteristics of the active devices formed in the island shaped monocrystalline semiconductor layer will not vary.

As described above, according to the manufacturing method of the present invention, the region of the monocrystalline semiconductor layer including sub-grain boundaries or grain boundaries is previously removed, and there will be no possibility of new crystal defects being formed if oxidation treatment or heat treatment is conducted in the process of forming active devices. Thus, unevenness in the properties of the active devices or their malfunctions can be restrained significantly in a semiconductor device of an SOI structure. With the region of a monocrystalline semiconductor layer including grain boundaries or sub-grain boundaries being previously removed, new defects will never be formed when the monocrystalline semiconductor layer is subjected to polishing treatment for the purpose of reducing the steps and recesses in its surface. Therefore, a monocrystalline semiconductor layer having an even and flat surface can be formed on an insulating layer, and it is therefore possible to achieve higher performances by a semiconductor device of a SOI structure.

Furthermore, according to the semiconductor device of the present invention, a transistor region is formed in the monocrystalline silicon island which is free of sub-grain boundaries, unevenness in the characteristics or malfunctioning of active devices can be suppressed in a semiconductor device of an SOI structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of a method of manufacturing a semiconductor device in accordance with the present invention will be described in detail in conjunction with the drawings.

EMBODIMENT 1

Figure 1:
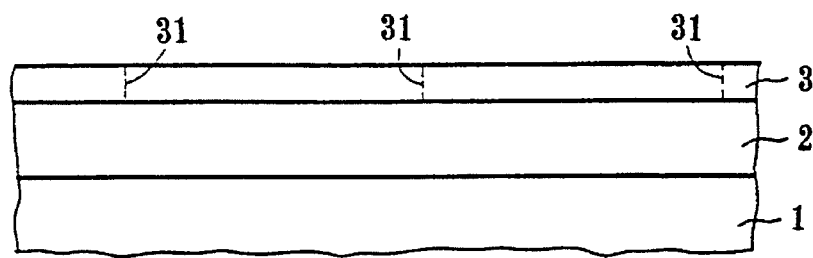
FIGS. 1–9 are sectional views sequentially showing the steps of first embodiment of a method of manufacturing a semiconductor device in accordance with the present invention.

Referring to FIG. 1, illustrated is the state of a monocrystalline semiconductor layer of SOI structure immediately after it is formed by a melt recrystallization method using an anti reflection film. An insulating layer 2 of $SiO_2$ is formed on a silicon monocrystalline substrate 1. A monocrystalline silicon layer 3 is formed on insulating film 2. Monocrystalline silicon layer 3 has sub-grain boundaries 31.

Figure 2:
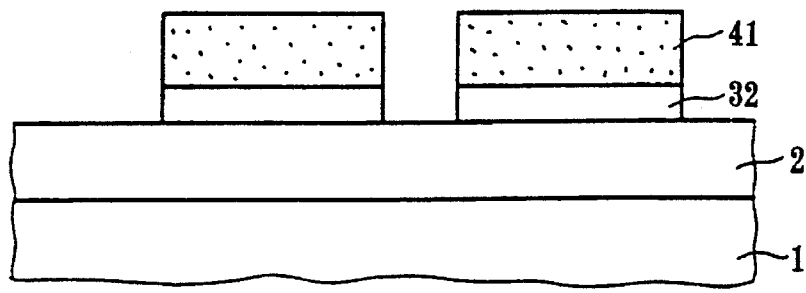

As shown in FIG. 2, a resist film 41 patterned by a photolithography technique is formed on the monocrystalline silicon layer. The monocrystalline silicon layer is selectively removed using resist film 41 as a mask and island shaped monocrystalline silicon layers 32 are formed. The selective removal of the monocrystalline silicon layer is conducted by removing only the region including the sub-grain boundaries 31. In other words, referring to FIG. 38, the portion of high temperatures in the process of recrystallization, i.e. only the region under anti reflection films 14 is removed. Thus removing the part of the monocrystalline silicon layer including the sub-grain boundaries 31 prevents further crystal defects from being generated with the sub-grain boundaries as the starting points when heat-treatment or oxidation treatment is conducted in subsequent steps of manufacturing active devices.

Figure 3:
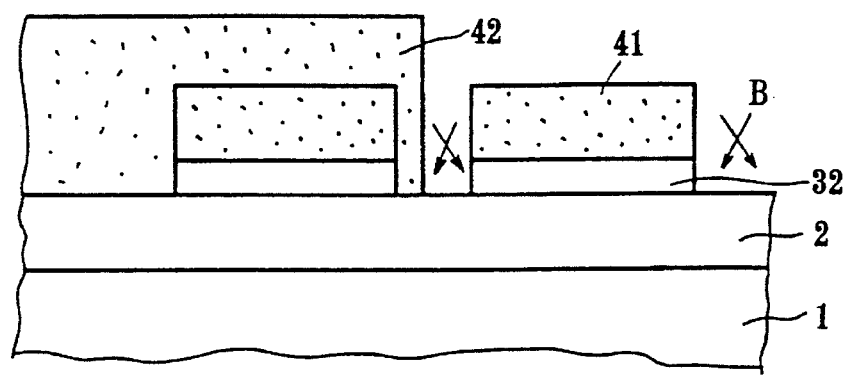

Subsequently, a resist film 42 is formed only in the region for forming a PMOS transistor as shown in FIG. 3. Boron (B) ions are implanted to the sidewalls of island shaped monocrystalline silicon layers 32 in the region for forming an NMOS transistor, using resist films 41 and 42 as masks. The ion implantation is conducted by injection of boron ions in slant directions with the substrate being rotated as shown in FIG. 3. The spacing between the NMOS transistor formation region and the PMOS transistor formation region is schematically illustrated in FIG. 3. However, it is necessary to decide the placement of the regions for forming active devices taking into consideration shadowing when spin oblique ion implantation as stated above is employed. When, for example, 45 degree oblique ion implantation is conducted into a monocrystalline silicon layer having a thickness of 0.5 µm using a resist film as thick as 1 µm as a mask, the spacing between the PMOS transistor formation region and NMOS transistor formation region should be 2.5 µm or more.

Figure 4:
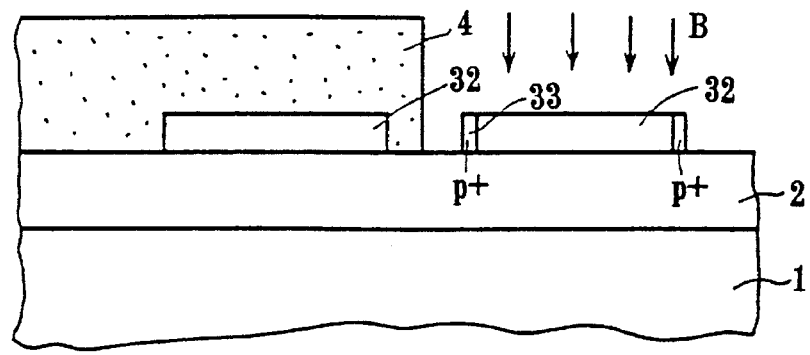

As shown in FIG. 4, resist film 41 on monocrystalline silicon layer 32 in the NMOS transistor formation region is removed. A $p^+$ impurity region 33 as a channel cut layer is formed in the region into which boron is implanted. Boron (B) ions are implanted into only the island shaped polycrystalline silicon layers 32 of the NMOS transistor formation region.

Figure 5:
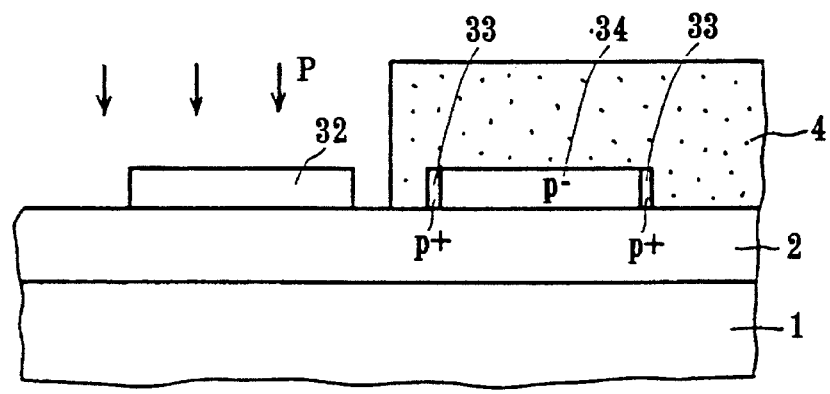

As shown in FIG. 5, only the surfaces of island shaped monocrystalline silicon layers 32 in the PMOS transistor formation region are exposed, and phosphorus (P) ions are implanted. The amounts of boron and phosphorus ions to be implanted at that time are determined depending upon threshold voltages set for the NMOS transistor and PMOS transistor, respectively. A $p^-$ region 34 and an $n^-$ region 35 are thus formed.

Figure 6:
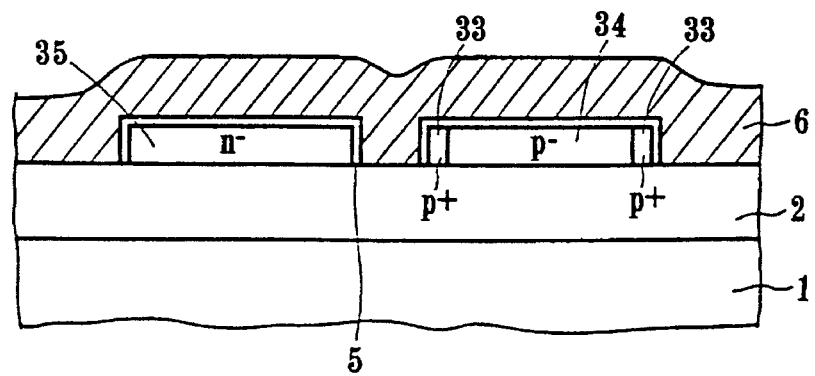

As shown in FIG. 6, an oxide film 5 is formed by thermal oxidation in the monocrystalline silicon layer. The surface of the monocrystalline silicon layer is subjected to thermal oxidation treatment at that time, but new crystal defects are restrained from forming, because the region including sub-grain boundaries have been removed. A polycrystalline silicon layer 6 for a gate electrode is then formed on the entire surface. Polycrystalline silicon layer 6 has its resistance reduced by being doped with an impurity.

Figure 7:
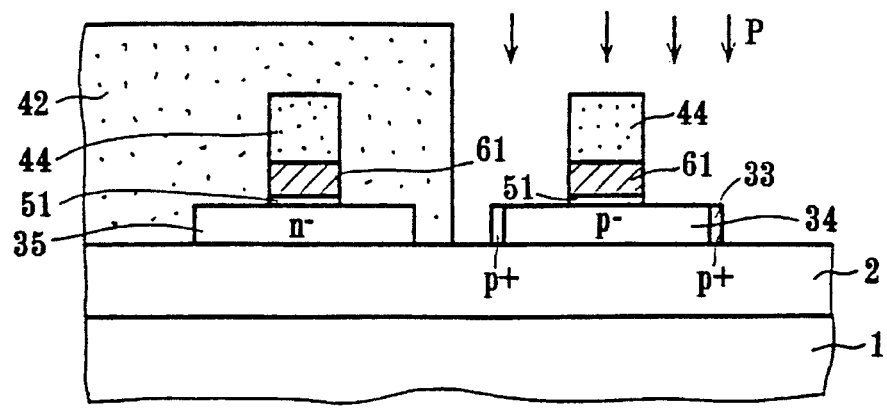

As shown in FIG. 7, polycrystalline silicon layer 6 and oxide film 5 are patterned using resist film 44 as a mask, forming a gate electrode 61 and a gate oxide film 51. Using as a mask resist film 42 formed covering the PMOS transistor formation region, phosphorus (P) ions are implanted into the source and drain formation region of an NMOS transistor.

Figure 8:
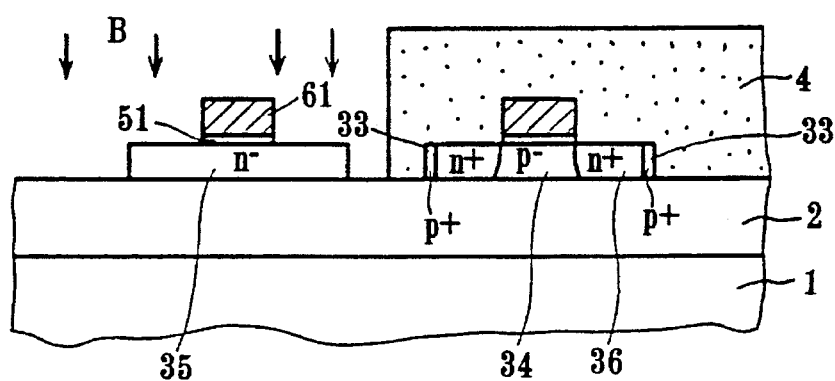

As shown in FIG. 8, using as a mask resist film 4 formed covering the nMOS transistor formation region, boron (B) ions are implanted into the source and drain formation region of a pMOS transistor. Then, heat-treatment is conducted for about 1 hour at a temperature of about 900° C. for recovering crystal defects produced by the ion implantation and activating the impurity. Thus, a $p^-$ impurity region 37 as the source and drain region of the pMOS transistor, and an n impurity region 36 as the source and drain region of the nMOS transistor are formed. Oxidation treatment or heat treatment is conducted in the process of forming active devices as stated above, the formation of further crystal defects is restrained, thus improving the properties of the active devices. At that time, the density of crystal defects existing in the monocrystalline silicon layer is $10^4$ cm$^{-2}$ or less, and the generation of new crystal defects due to the heat treatment or oxidation treatment would be significantly restrained.

Figure 9:
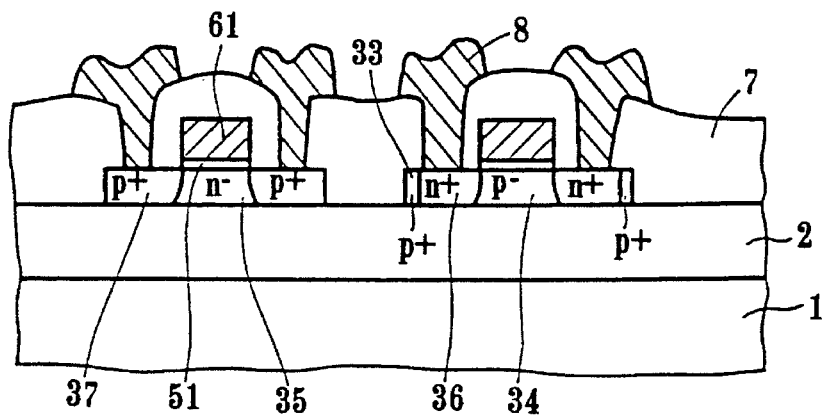

As shown in FIG. 9, an interlayer insulating film 7 and a metal interconnection layer 8 are formed as in the case of conventional methods.

Resist film 4 is directly formed on the monocrystalline silicon layer in the process shown in FIGS. 4 and 5, but resist film 4 may be formed after the surface of the monocrystalline silicon layer is covered with a film formed of such as $SiO_2$ for protecting the surface of the monocrystalline silicon layer. The film of $SiO_2$ may be a thermal oxidation film or a CVD film.

Figure 10A:
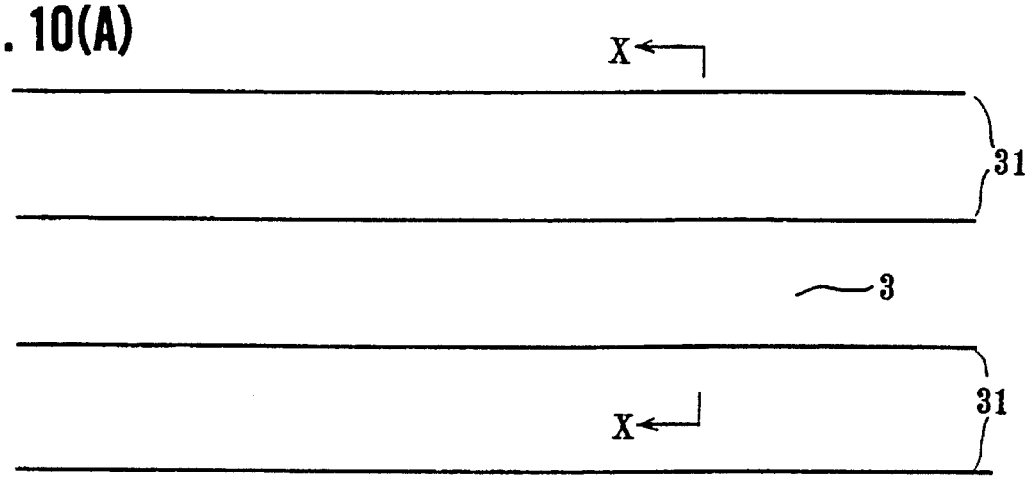
FIG. 10 includes top plan views (A), (B), and (C) corresponding to FIGS. 1, 2, and 9.
Figure 10B:
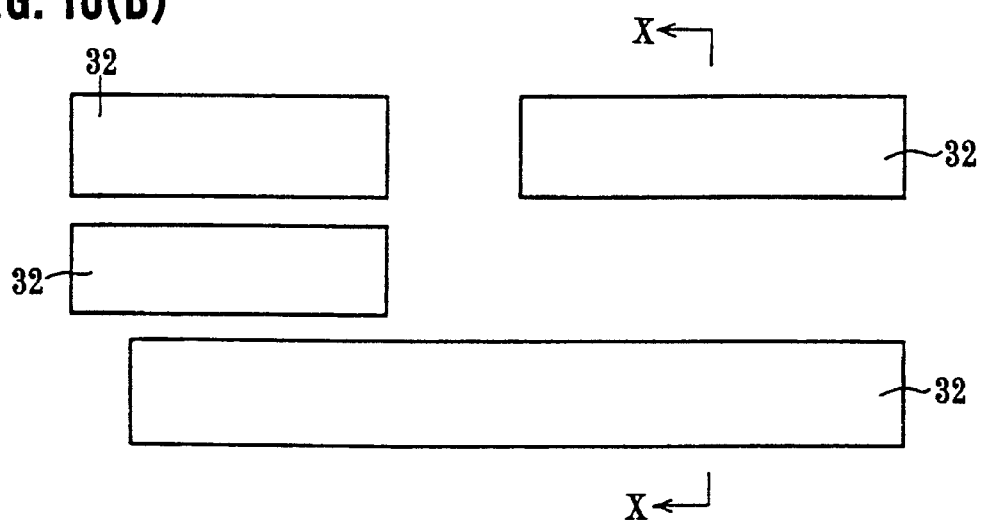
Figure 10C:
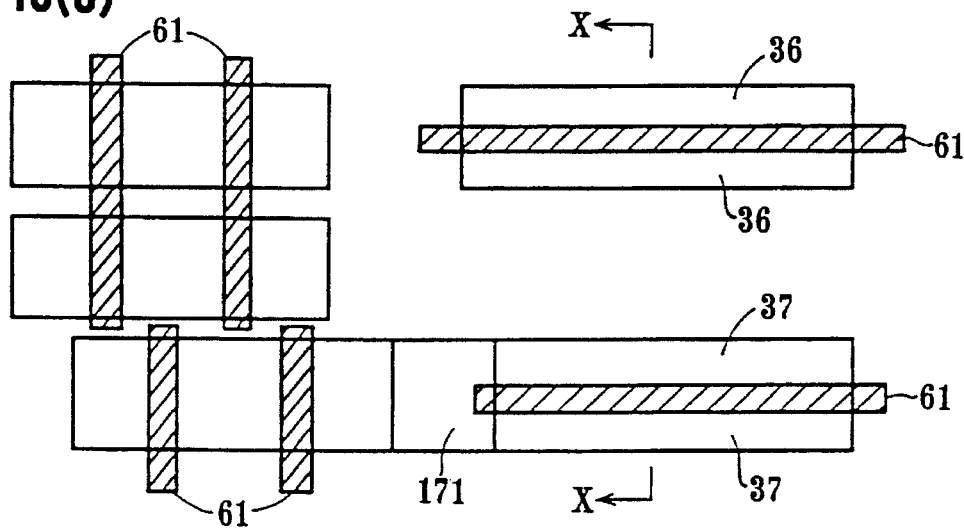

(A), (B), and (C) in FIG. 10 are top plan views corresponding to FIGS. 1, 2, and 9, respectively. FIG. 1, 2, and 9 show cross sections taken along lines X—X in (A), (B), (C) in FIG. 10, respectively. As shown in FIG. 10 at (A), sub-grain boundaries 31 are included in a monocrystalline silicon layer 3. As shown in FIG. 10 at (B), an island shaped monocrystalline silicon layer 32 is formed. Patterning of the island shaped monocrystalline silicon layer 32 includes photolithography process. Heat treatment at a temperature of 200° C. or less such as the photolithography process will not produce crystal defects caused by sub-grain boundaries. The inventors discovered that crystal defects are created due to sub-grain boundaries if, for example, heat-treatment at the temperature of 600°–700° C. or more, e.g. formation of a film by chemical vapor deposition or thermal oxidation treatment is conducted. Accordingly, thereafter a gate electrode 61 is formed as shown in FIG. 10 at (C), an $n^+$ impurity region 36 and a $p^+$ impurity region 37 are formed as source/drain regions, and generation of further crystal defects is still suppressed.

Figure 11:
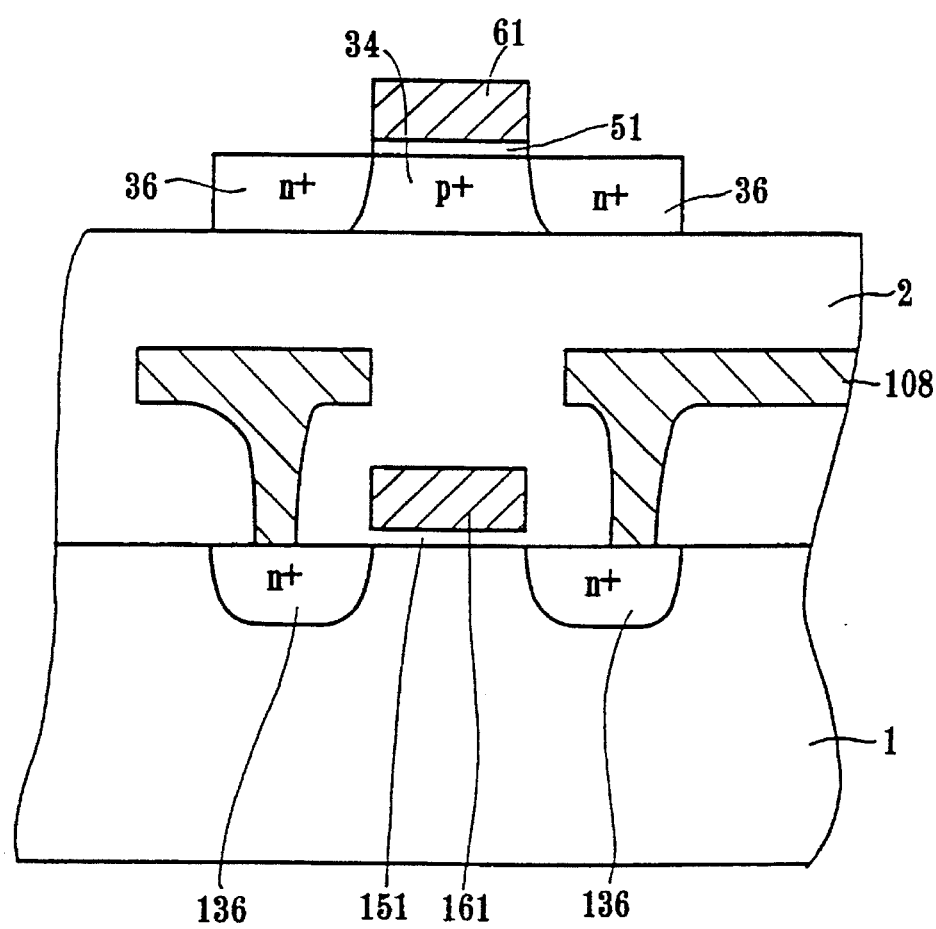
FIG. 11 is a partial cross section showing a detailed cross sectional structure of the semiconductor device shown in FIG. 9.

FIG. 11 is a cross sectional view showing in detail a structure under an n channel MOS transistor on the right side of FIG. 9. Referring to FIG. 11, $n^+$ impurity regions 136 as source/drain regions are formed in a silicon monocrystalline substrate 1. Between these two $n^+$ impurity regions 136, a gate electrode 161 is formed on silicon monocrystalline substrate 1 with a gate oxide film 151 interposed therebetween. A metal interconnection layer 108 is formed in an insulating layer 2 so as to be connected to $n^+$ impurity region 136. The n channel MOS transistor including a $p^-$ region 34, $n^+$ impurity region 36, gate oxide film 51, and gate electrode 61 is formed on insulating layer 2.

EMBODIMENT 2

Figure 12:
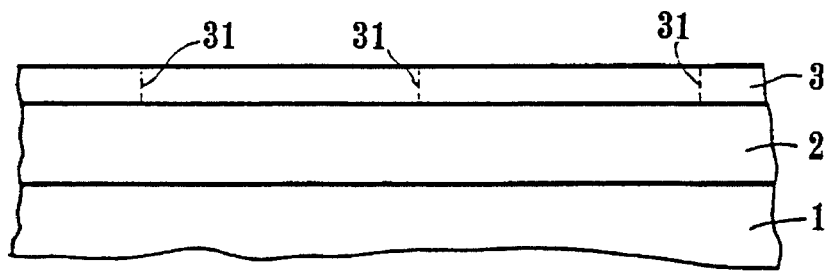
FIGS. 12–17 are sectional views sequentially showing the steps in a second embodiment of a method of manufacturing a semiconductor device in accordance with the present invention.

Referring to FIG. 12, the state immediately after monocrystalline silicon layer 3 is formed is illustrated.

Figure 13:
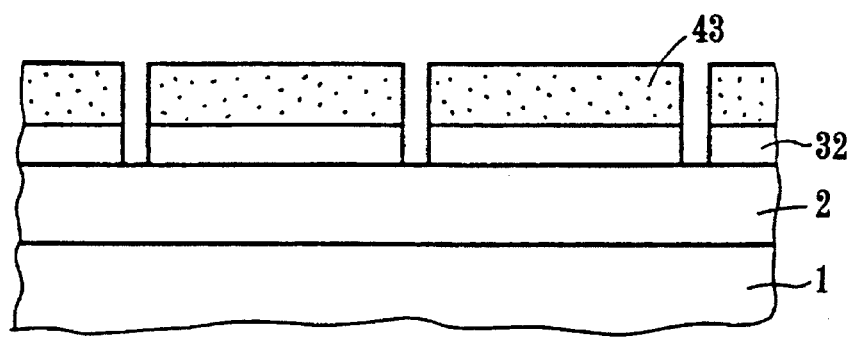

As shown in FIG. 13, using a resist film 43 patterned by a photolithography technique as a mask, at least a part of the monocrystalline silicon layer in which sub-grain boundaries exist is removed away. Island shaped monocrystalline silicon layers 32 are thus formed. The selective removal of the monocrystalline silicon layer is similar to the process shown in FIG. 2.

Figure 14:
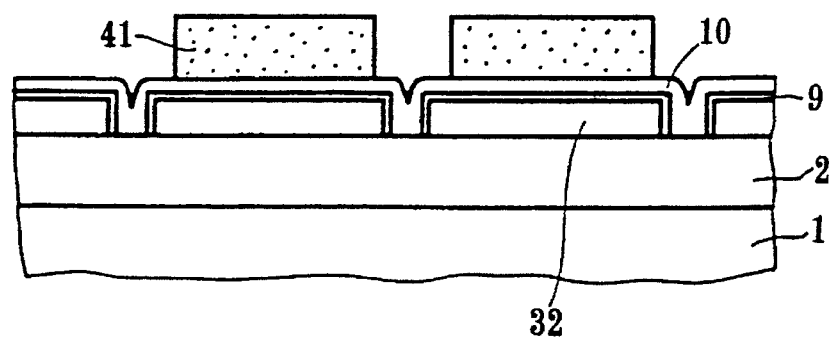

Then, as shown in FIG. 14, after the removal of resist film 43, an underlying oxide film (silicon oxide film) 9 and a silicon nitride film 10 are sequentially formed. The thickness of underlying oxide film 9 is about 500 Å, and the thickness of silicon nitride film 10 is about 1000 Å. Patterned resist film 41 is formed only in an active device formation region.

Figure 15:
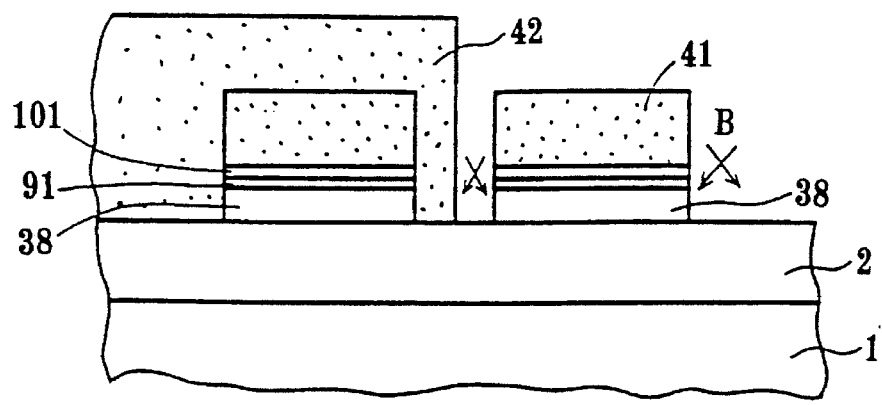

As shown in FIG. 15, the silicon nitride film, silicon oxide film and monocrystalline silicon layer are selectively etched away using resist film 41 as a mask, and a silicon nitride film 101, an underlying oxide film 91 and an island shaped monocrystalline silicone layer 38 are formed. A resist film 42 is formed covering island shaped monocrystalline silicon layer 38 in the pMOS transistor formation region. Using resist films 41 and 42 as masks, boron (B) ions are implanted to the sidewalls of island shaped monocrystalline silicon layer 38 in the nMOS transistor formation region in oblique directions. This process corresponds to the process in the first embodiment shown in FIG. 3.

Figure 16:
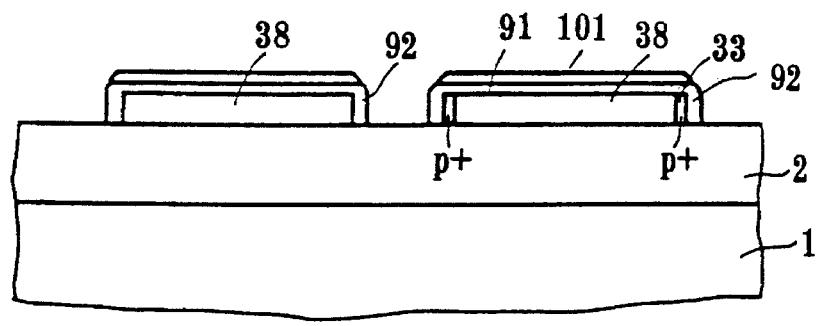

As shown in FIG. 16, heat-treatment is conducted in an oxidative atmosphere after resist films 41 and 42 are removed. A thick silicon oxide film 92 is formed on the sidewalls of island shaped monocrystalline silicon layer 38. In the nMOS transistor formation region, a $p^+$ impurity region 33 is formed as a channel cut layer inside silicon oxide film 92. When the island monocrystalline silicon layer is subjected to heat treatment or oxidation treatment, with at least a part of the monocrystalline silicon layer containing sub-grain boundaries as shown in FIG. 11 having been removed, new crystal defects with the sub-grain boundaries as the starting point are restrained from being generated. The thickness of silicon oxide film 92 formed on the sidewalls of island shaped monocrystalline silicon layer 38 should be sufficiently thick so that parasitic transistors formed on the sidewalls do not operated in the range of the operation voltage of the MOS transistors. For example, the thickness of silicon oxide film 92 is expected to be in the range between 2000 and 3000 Å.

Figure 52:
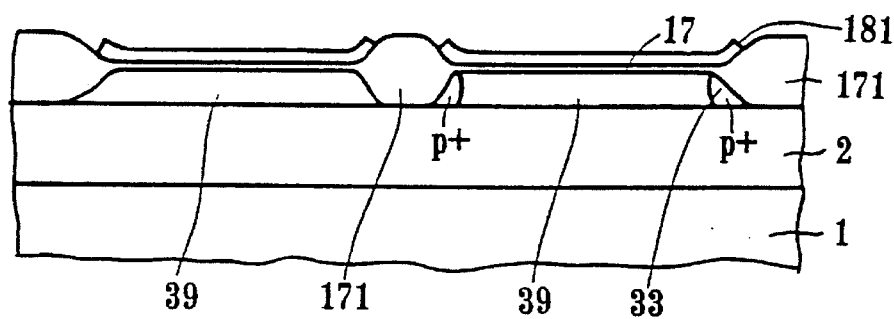
Figure 53:
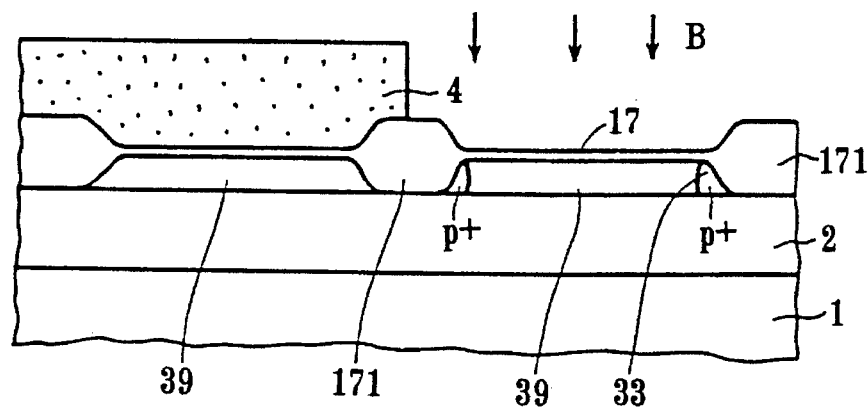
Figure 54:
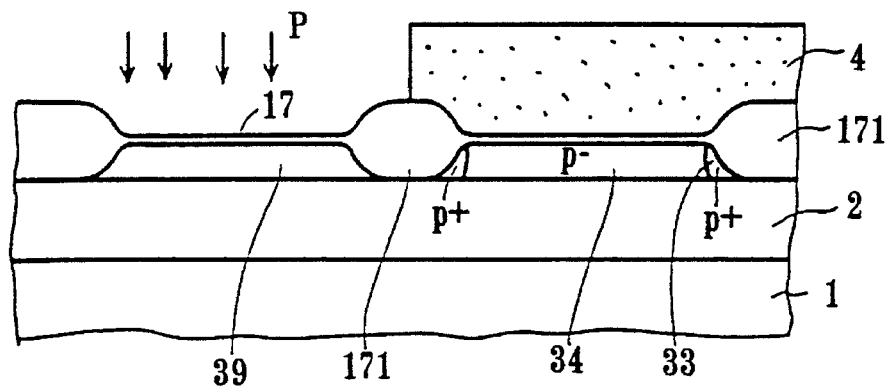
Figure 55:
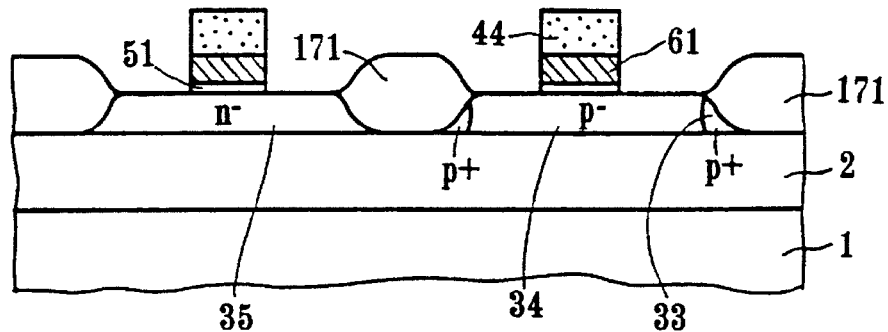
Figure 56:
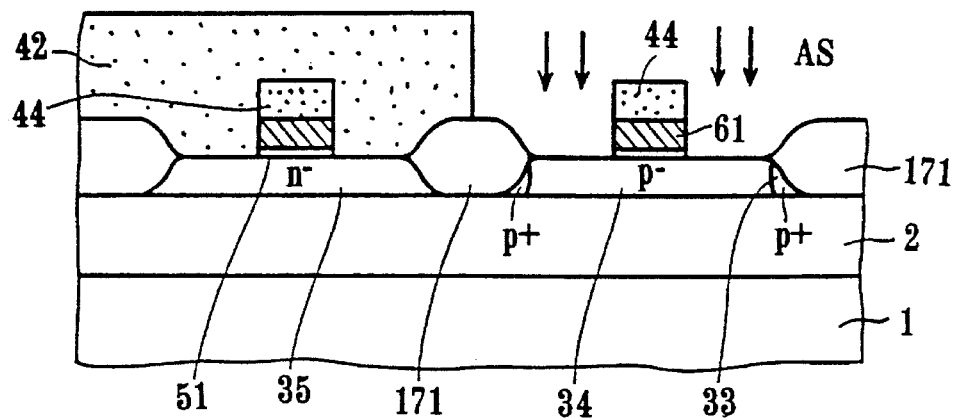
Figure 57:
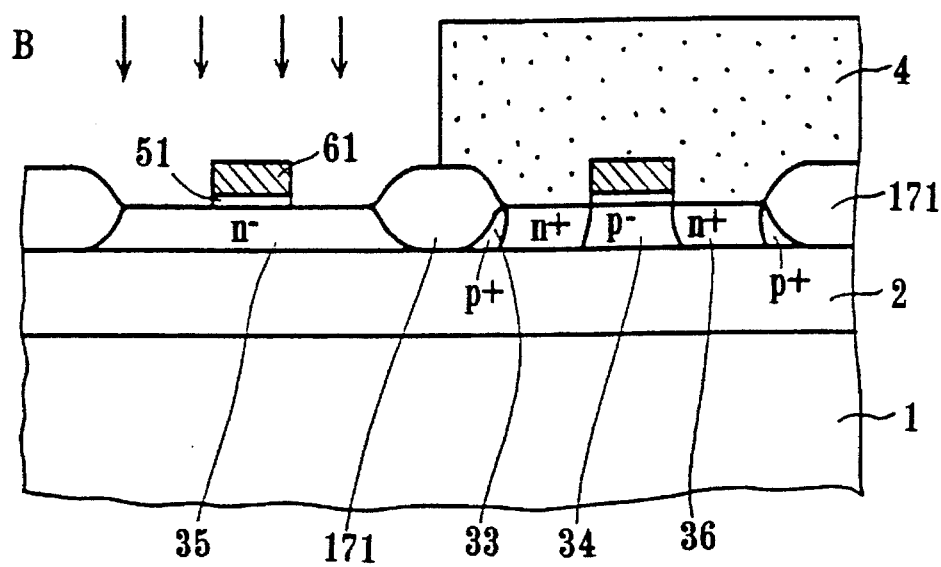
Figure 58:
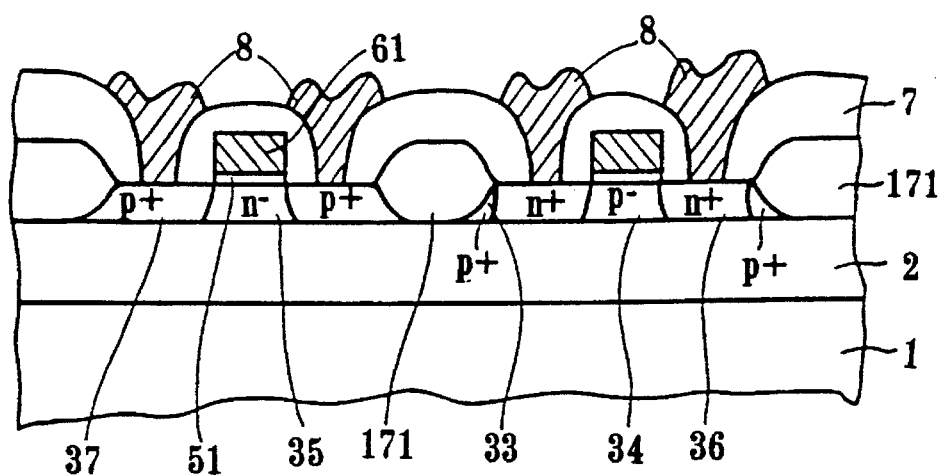
Figure 59:
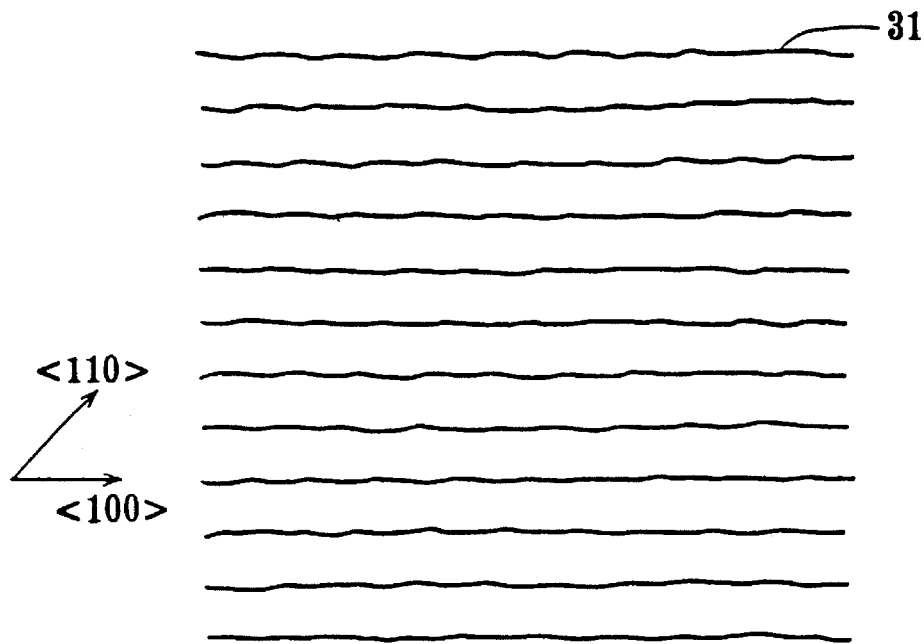
FIG. 59 is a top plan view schematically showing the state of the surface of a monocrystalline silicon layer observed immediately after it is formed by a melt recrystallization method using an anti reflection film.
Figure 60:
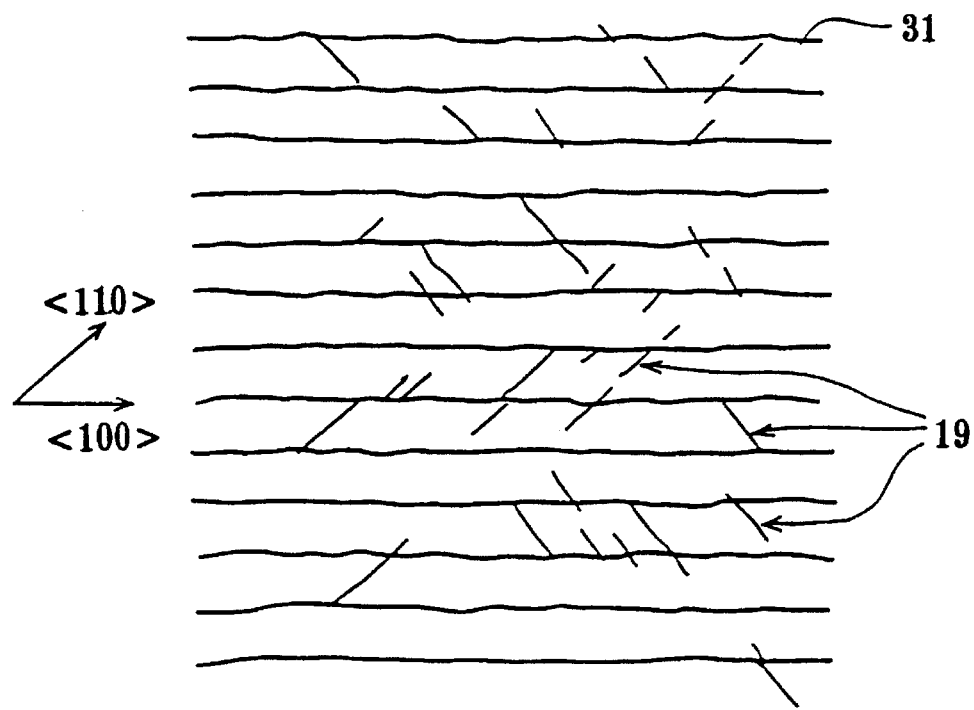
FIG. 60 is a top plan view schematically showing the state of the surface of a monocrystalline silicon layer observed after a heat oxide film is formed on the surface of the monocrystalline silicon layer obtained by a melt recrystallization method using an anti reflection film.
Figure 61A:
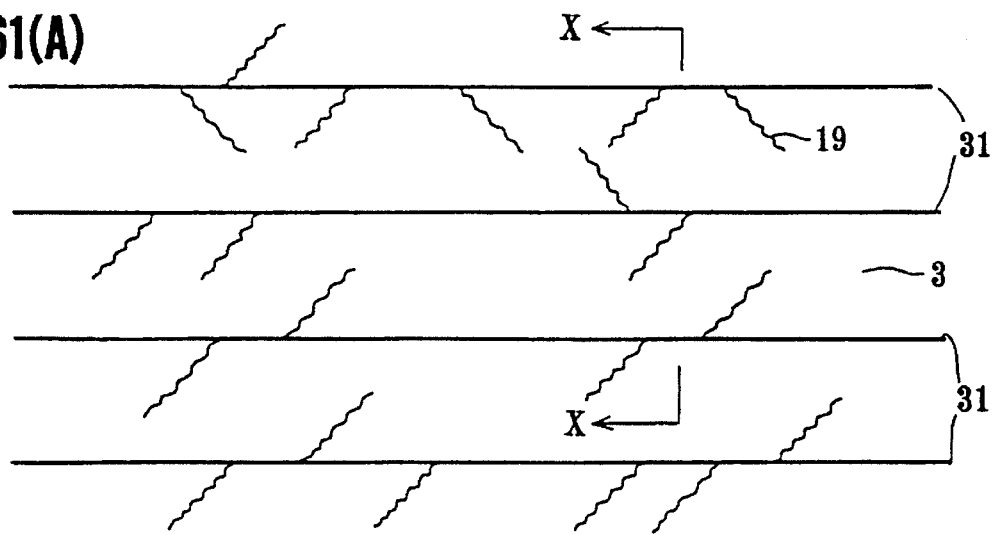
FIG. 61 includes plan views (A), (B), and (C) corresponding to FIGS. 49, 52 and 58, respectively.
Figure 61B:
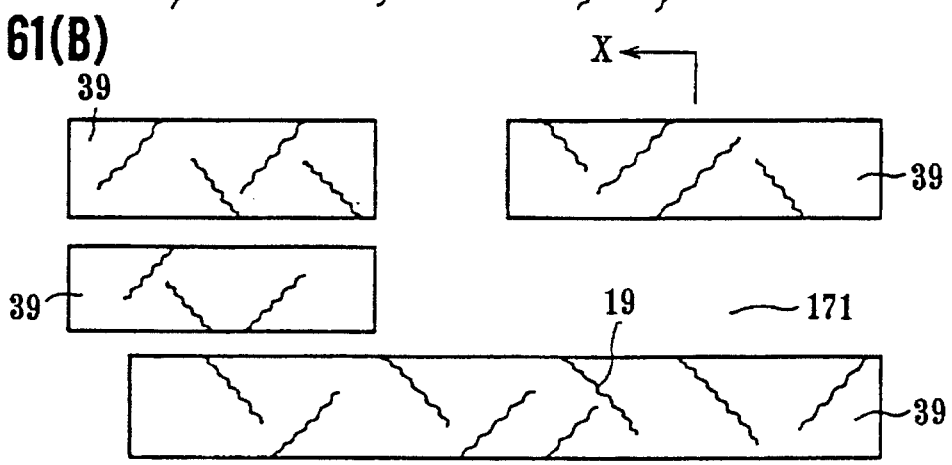
Figure 61C:
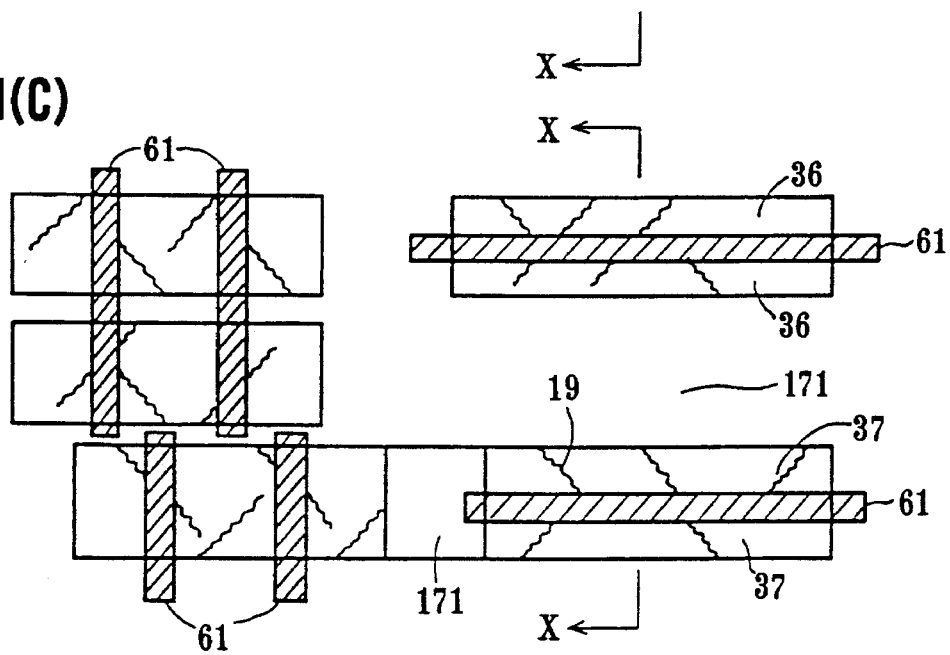

The manufacturing process shown in FIG. 16 corresponds to the process shown in FIG. 52 in connection with the conventional example, and LOCOS (Local Oxidation of Silicon) isolation is employed for isolating active device formation regions. However, in the case of the conventional LOCOS isolation structure shown in FIG. 52, the part of the monocrystalline silicon layer containing sub-grain boundaries are not removed, and a thick isolation oxide film is formed by thermal oxidation treatment. Meanwhile, in the case of the LOCOS isolation structure shown in FIG. 16 as an embodiment of the present invention, after the part of the monocrystalline silicon layer containing the sub-grain boundaries is removed, a thick isolation oxide is formed by thermal oxidation treatment, in other words by thermally oxidizing the sidewalls of island shaped monocrystalline silicon layer.

Figure 17:
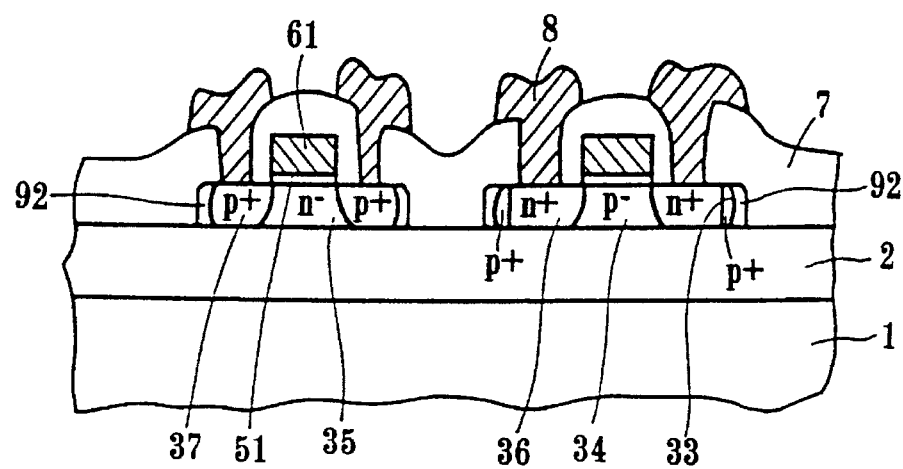

Finally, as shown in FIG. 17, active devices and metal interconnections are formed by the same step as the manufacturing step of a usual CMOS transistor.

As described above, a method of manufacturing a semiconductor device in accordance with the present invention can be applicable to a method of manufacturing a semiconductor device employing mesa isolation as a structure of isolating element formation regions (FIGS. 1–9) and to a method of manufacturing a semiconductor device of an SOI structure employing LOCOS isolation (FIGS. 12–17).

EMBODIMENT 3

FIGS. 18–22 are partially sectional views showing in the order of steps another embodiment in which a method of manufacturing a semiconductor device in accordance with the present invention is applied to a method of manufacturing a semiconductor device of an SOI structure employing LOCOS isolation.

Figure 18:
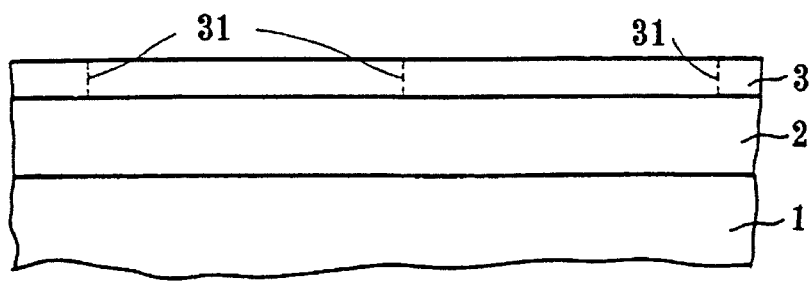
FIGS. 18–22 are sectional views sequentially showing the steps in a third embodiment of a method of manufacturing a semiconductor device in accordance with the present invention.

FIG. 18 illustrates the state immediately after a monocrystalline silicon layer 3 is formed by a melt recrystallization method using an anti reflection film.

Figure 19:
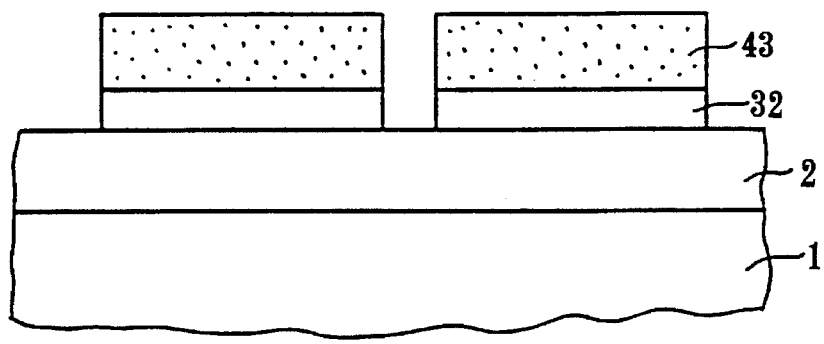

Referring to FIG. 19, using as a mask a resist film 43 patterned by a photolithography technique, the monocrystalline silicon layer including sub-grain boundaries 31 is selectively removed. Island shaped monocrystalline silicon layers 32 are thus formed.

Figure 20:
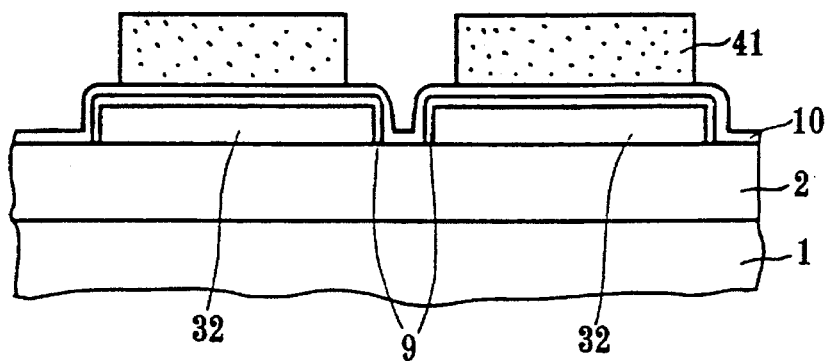

As shown in FIG. 20, after the removal of resist film 43, an underlying oxide film 9 having a thickness of about 500 Å and a silicon nitride film 10 having a thickness of about 1000 Å are sequentially formed on island shaped monocrystalline silicon layer 32. A resist film 41 is formed only in the region for forming an active device.

Figure 21:
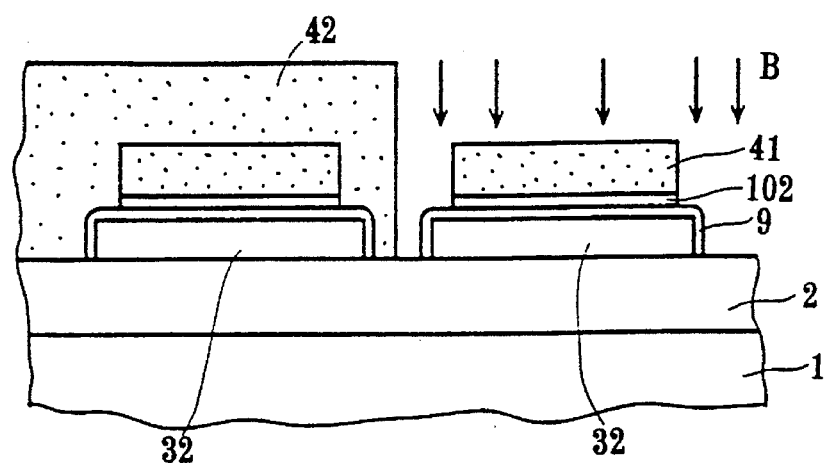

As shown in FIG. 21, using resist film 41 as a mask, silicon nitride film 10 is selectively removed, and a silicon nitride film 102 is formed. Subsequently, a resist film 42 is formed covering only island shaped monocrystalline silicon layer 32 in a pMOS transistor formation region. Using resist films 41 and 42 as masks, boron (B) ions are implanted. Thus, boron ions are implanted into the sidewalls of island shaped monocrystalline silicon layer 32 in an nMOS transistor formation region.

Figure 22:
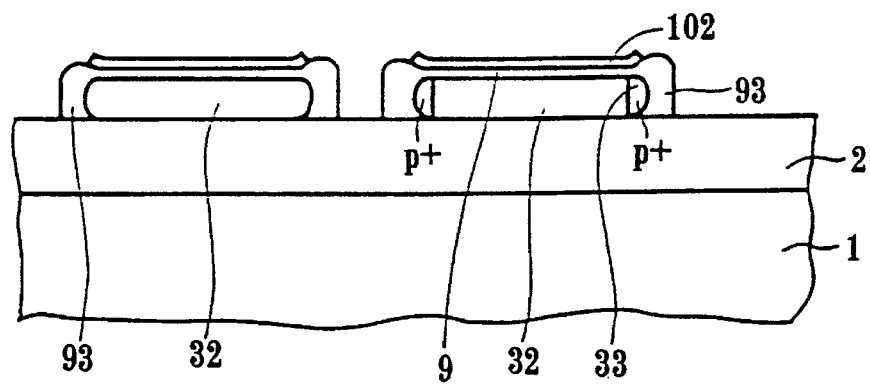

As shown in FIG. 22, after the removal of resist films 41 and 42, thermal treatment is conducted in an oxidative atmosphere. A $p^+$ impurity region 33 as a channel cut layer is formed on the sidewalls of island shaped monocrystalline silicon layer 32 in the nMOS transistor formation region, while thick isolation oxide films 93 are formed on the sidewalls of island shaped monocrystalline silicon layers 32 in the pMOS and nMOS transistor formation regions. An island shaped monocrystalline silicon layer having LOCOS isolation structure substantially the same as the structure shown in FIG. 16 is formed with the essential difference in the shapes of isolation oxide films. Active devices are formed in the same steps as those of usual manufacturing process of a CMOS transistor.

In the Above-described embodiments, after a monocrystalline silicon layer is formed, the region in which sub-grain boundaries exist is almost completely removed prior to thermal treatment or oxidation treatment, and the formation of further crystal defects is prevented. However, removing at least a part of the monocrystalline silicon layer in the region including the sub-grain boundaries makes it possible to restrain further crystal defects from being produced even if thermal treatment or oxidation treatment is conducted thereafter.

Also in the above-described embodiments, the cases have been described in which a manufacturing method in accordance with the present invention is applied to a method of forming a monocrystalline silicon layer using an anti reflection film. However, so far as employing a method of providing a temperature distribution at least in melted silicon, and forming a monocrystalline silicon layer by recrystallization, sub-grain boundaries or grain boundaries do exist in the region corresponding to the high temperature portion in the temperature distribution at the time of melting. Therefore, application of a manufacturing method in accordance with the present invention to other methods of manufacturing a semiconductor device of an ISO structure using other melt recrystallization method can provide similar effects.

Also, although in the above-described embodiments, a manufacturing method has been described in which active devices are formed on a single monocrystalline silicon layer, the present invention can be applied to a method of manufacturing a three-dimensional circuit device structure in which active devices are formed in a multilayer monocrystalline silicon layer.

According to a method of manufacturing a semiconductor device in accordance with another aspect of the present invention, after the part of a monocrystalline silicon layer including sub-grain boundaries is selectively removed, the surfaces of island shaped monocrystalline silicon layers are planarized by polishing. The polishing process is conducted, for example, between the processes shown in FIGS. 5 and 6, the processes shown in FIGS. 13 and 14, and the processes shown in FIGS. 19 and 20. The surfaces of island shaped monocrystalline silicon layers are polished after the part of the monocrystalline silicon layer including the sub-grain boundaries is removed in any of the cases. Therefore, no further crystal defect will be produced which starts from the sub-grain boundaries as a result of the polishing. Now, a description will be provided on a method of polishing applicable to a method of manufacturing a semiconductor device in accordance with the present invention.

EMBODIMENT A

Figure 23:
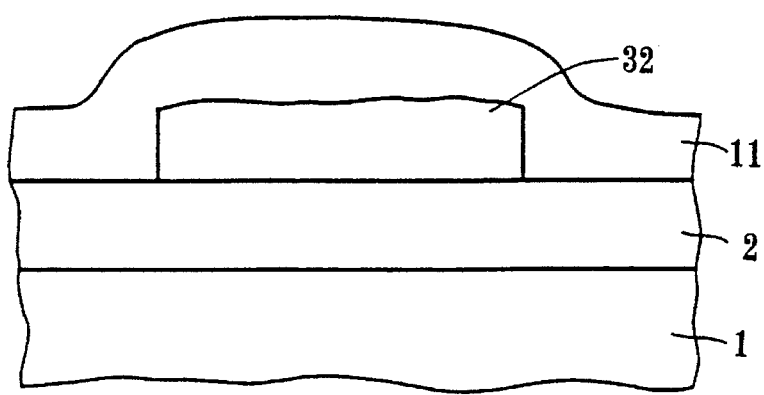
FIGS. 23–25 are sectional views sequentially showing the steps of a first embodiment of a polishing process in a method of manufacturing a semiconductor device in accordance with the present invention.

Referring to FIG. 23, a silicon oxide film 11 is formed covering island shaped monocrystalline silicon layer 32 removed of the region including the sub-grain boundaries. The thickness of silicon oxide film 11 is about 300 nm.

Figure 24:
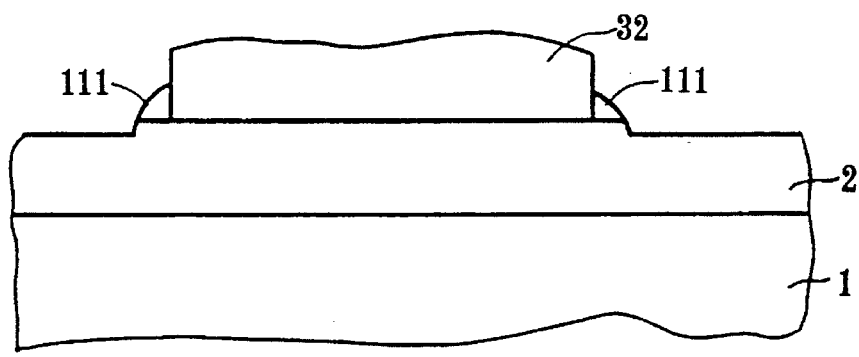
Figure 25:
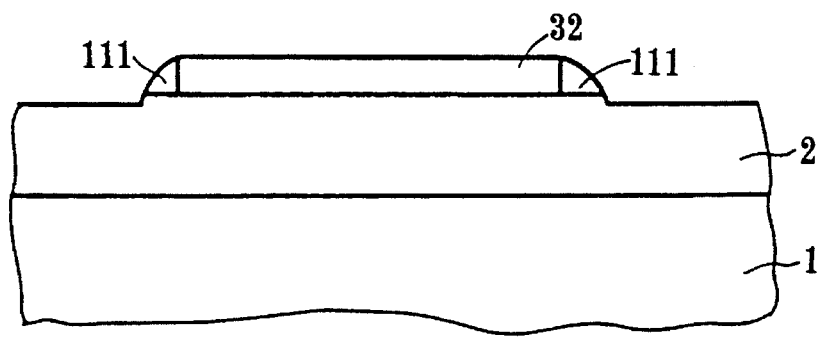

Then, as shown in FIG. 24, silicon oxide film 11 is subjected to isotropic etching treatment, and sidewall silicon oxide films 111 are formed on the sidewalls of island shaped monocrystalline silicon layer. The height of sidewall silicon oxide film 111 can be controlled by conveniently changing etching time. Rigid polishing is conducted in the state as shown in FIG. 24, with sidewall silicon oxide films 11 formed on the sidewalls of island shaped monocrystalline silicon layer 32 acting as a stopper for the polishing process, island shaped monocrystalline silicon layer 32 having an even thickness can be provided. The state after being thus polished is shown in FIG. 25.

A film acting as a stopper is formed on the sidewalls of island monocrystalline silicon layer 32 in order to increase the precision of polishing as described above, a substance constituting the film is desirably formed of a substance having a lower polishing speed than a substance constituting the island shaped monocrystalline silicon layer. The most suitable material for the film would be a silicon oxide film. This is because the silicon oxide film is of the same material as that of the surface plate used in the rigid polishing method, its polishing speed is very low, and the material is consistent with active device formation process in subsequent steps.

EMBODIMENT B

Figure 26:
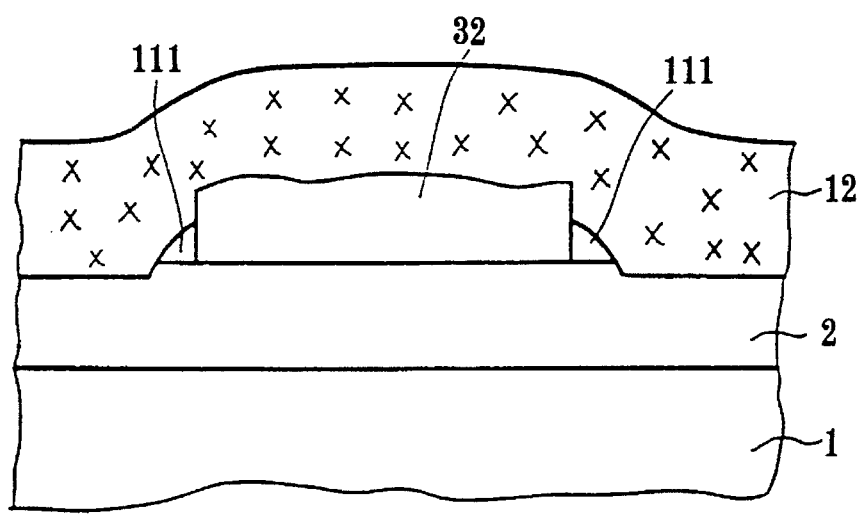
FIGS. 26–27 are sectional views sequentially showing the steps of a second embodiment of a polishing process in a method of manufacturing a semiconductor device in accordance with the present invention.
Figure 27:
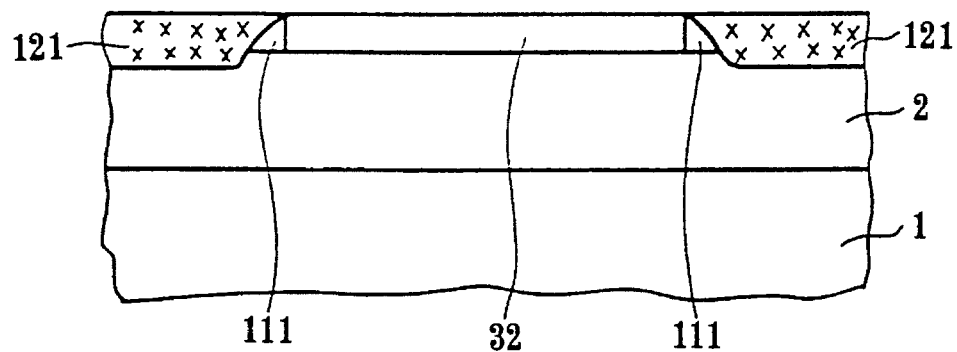

Another approach is a method of polishing shown in FIGS. 26 and 27 as another embodiment for improving polishing precision. In the foregoing embodiment, a method of polishing island shaped monocrystalline silicon layer itself is employed. In such a method, considerable care should be taken at the time of polishing so that the island shaped monocrystalline silicon layer will not come off or partially come off, thereby leaving scratches on the surface. With the thickness of island shaped monocrystalline silicon layer being originally about 0.55 μm, it is difficult to polish the entire surface of the wafer with high precision. Therefore, as shown in FIG. 26, a polycrystalline silicon layer 12 is formed on the entire surface prior to polishing operation. The thickness of polycrystalline silicon layer 12 is larger than the thickness of island shaped polycrystalline silicon layer 32. Then, as shown in FIG. 27, polycrystalline silicon layer 12 is polished by a rigid polishing method, and island shaped monocrystalline silicon layer 32 is polished using sidewall silicon oxide film 111 as a stopper thus providing even island shaped monocrystalline silicon layer 32 with a flat surface. This method can prevent the island shaped monocrystalline silicon layer from coming off in the polishing process. Also, the polycrystalline silicon layer formed on the island shaped monocrystalline silicon layer also functions as a necessary allowance for increasing the polishing precision, and, therefore, an island shaped monocrystalline silicon layer even over the entire surface of the wafer and having a flat surface can advantageously be provided. After the polishing process, the polycrystalline silicon layer fills the space between the island shaped element formation regions, and, therefore planarization effect can be provided on the enter surface of the wafer. Furthermore, the polycrystalline silicon layer has been described by way of illustration, but similar effects can be provided to any layer having a polishing speed similar to that of the island shape monocrystalline silicon layer.

EMBODIMENT C

FIGS. 28–33 are partially sectional views showing a method of manufacturing a semiconductor device of an SOI structure when a stopper material used in polishing process fills the space between island shaped monocrystalline silicon layers.

Figure 28:
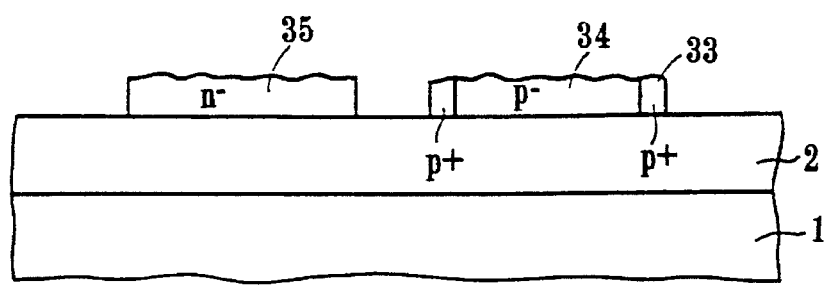
FIGS. 28–33 are sectional views sequentially showing the steps in a third embodiment of a polishing process in a method of manufacturing a semiconductor device in accordance with the present invention.

Referring to FIG. 28, island shaped monocrystalline silicon layers including an $n^-$ region 35 and a $p^-$ region 34, respectively are formed. $P^+$ impurity regions 33 are formed as channel cut layers on the opposing sides of $p^-$ region 34.

Figure 29:
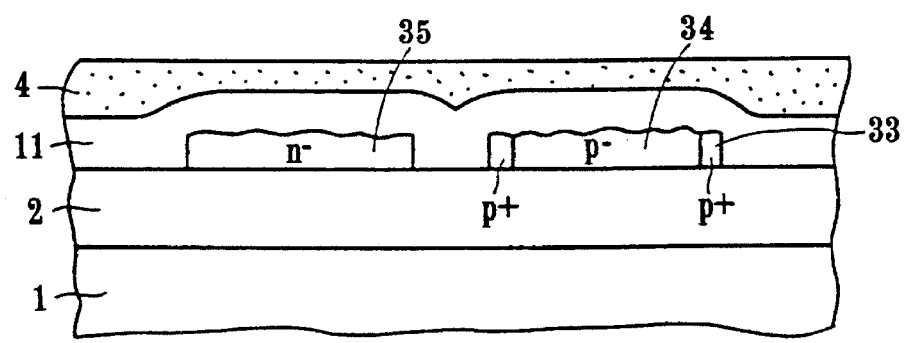

Referring to FIG. 29, a silicon oxide film 11 covering the island shaped monocrystalline silicon layers is formed. A resist film 4 is formed on silicon oxide film 11.

Figure 30:
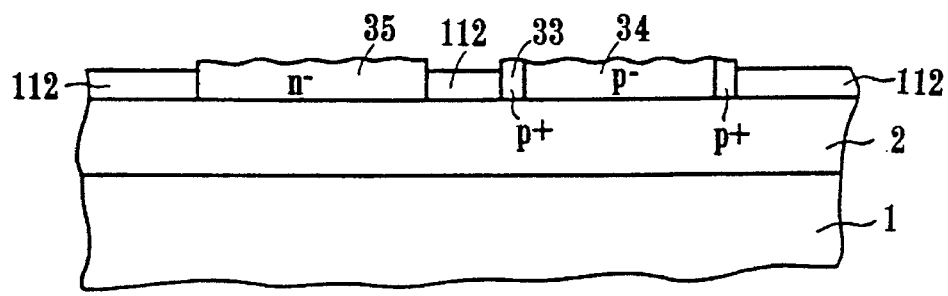

Referring to FIG. 30, resist film 4 and silicon oxide film 11 are removed by means of etch back method. Thus, a silicon oxide film 112 which functions as a stopper material in polishing fills the space between the island shaped monocrystalline silicon layers.

Figure 31:
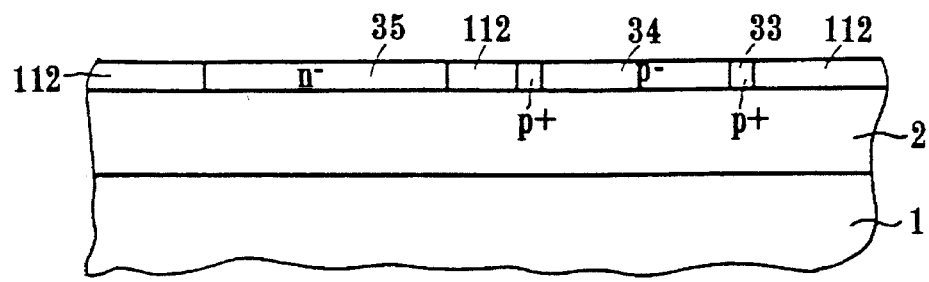

As shown in FIG. 31, using silicon oxide film 112 as the stopper material in polishing, the surface of the island shaped monocrystalline silicon layer is evenly polished and planarized.

Figure 32:
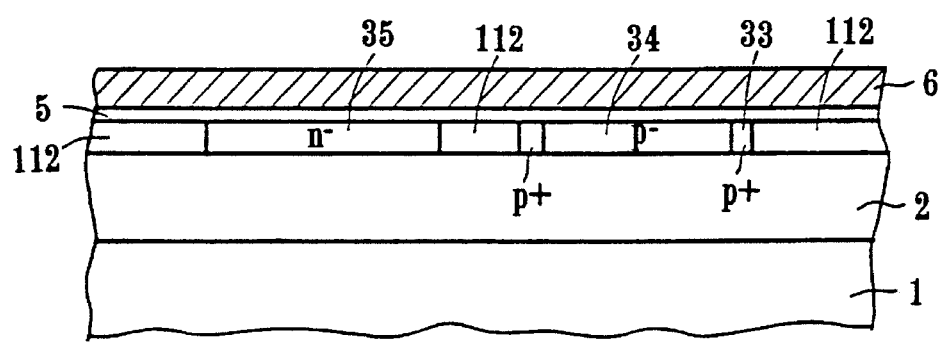

Then, as shown in FIG. 32, an oxide film 5 and a polysilicon layer 6 for a gate electrode are formed on the entire surface. Polycrystalline silicon layer 6 is doped with an impurity to reduce its resistance.

Figure 33:
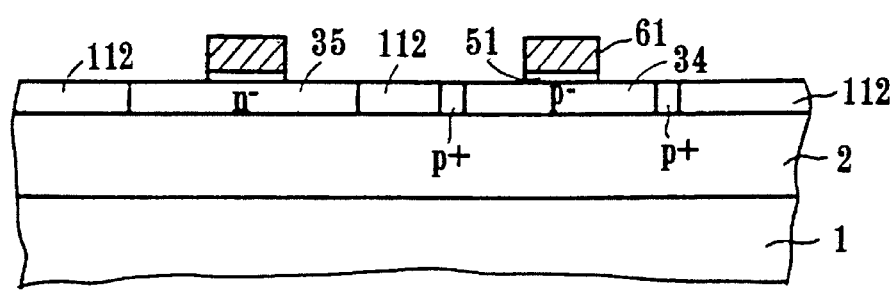

As shown in FIG. 33, selective etching by a photolithography technique permits a gate electrode 61 and a gate oxide film 51 to be formed on the island shaped monocrystalline silicon layers. At that time, the region between the island shaped monocrystalline silicon layers has already been filled with silicon oxide film 112 used as the stopper a material in polishing, and the residue of the polysilicon layer will not be left behind on the sidewalls of the island shaped monocrystalline silicon layer in a process of an isotropic etching for forming gate electrode 61.

EMBODIMENT D

FIGS. 34–37 are partial cross sectional views sequentially showing steps in another embodiment of a method of manufacturing a semiconductor device of an SOI structure when the space between island-shaped monocrystalline silicon layers is filled with a stopper material used in a polishing process.

Figure 34:
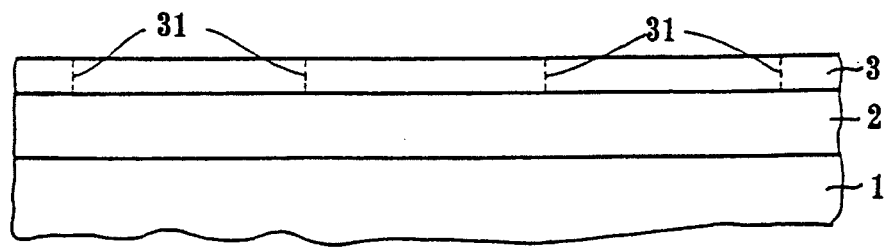
FIGS. 34–39 are cross sectional views sequentially showing the steps in a fourth embodiment of a polishing process in a manufacturing method of a semiconductor device in accordance with the present invention.

Referring to FIG. 34, a monocrystalline silicon layer 3 including sub-grain boundaries 31 is formed on an insulating layer 2.

Figure 35:
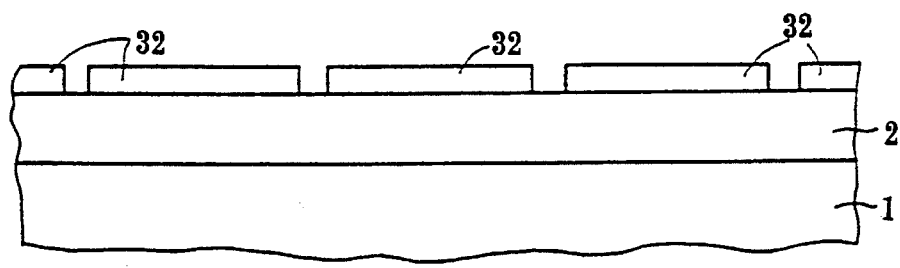

Referring to FIG. 35, a part of the monocrystalline silicon layer including the sub-grain boundaries is removed, and an island shaped monocrystalline silicon layer 32 is formed as a result. At that time, a part to form an active device may be shaped into an island so that no sub-grain boundary is included therein.

Figure 36:
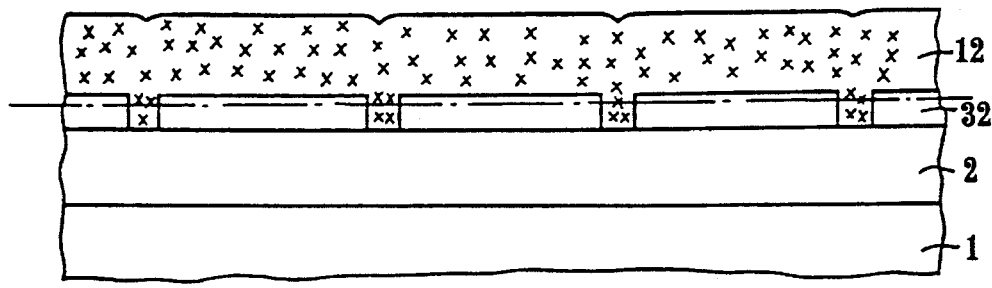

Referring to FIG. 36, a polycrystalline silicon layer 12 is formed covering island shaped monocrystalline silicon layers 32 and filling the spaces therebetween. A thickness of 5000 Å or more is sufficient for polycrystalline silicon layer 12. As defined by a chain dotted line in FIG. 36, the surface layer of island shaped monocrystalline silicon layer 32 is polished from the side of the polycrystalline silicon layer 12 to a desired depth.

Figure 37:
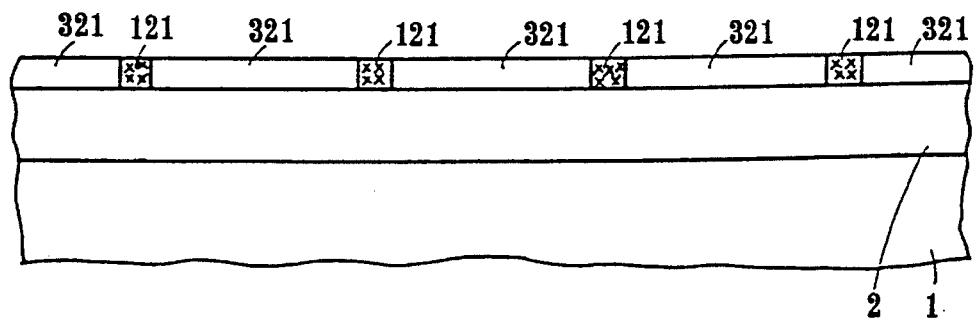

Thus, as shown in FIG. 37, an island shaped monocrystalline silicon layer 321 having a flat and even surface is provided. A polycrystalline silicon layer 121 fills the spaces between island shaped monocrystalline silicon layers 321. Thus, polycrystalline silicon layer 121 is used as a stopper material in polishing. Crystal defects due to sub-grain boundaries are not generated in this process, and the monocrystalline silicon layer does not come off by the polishing process itself.

Figure 38:
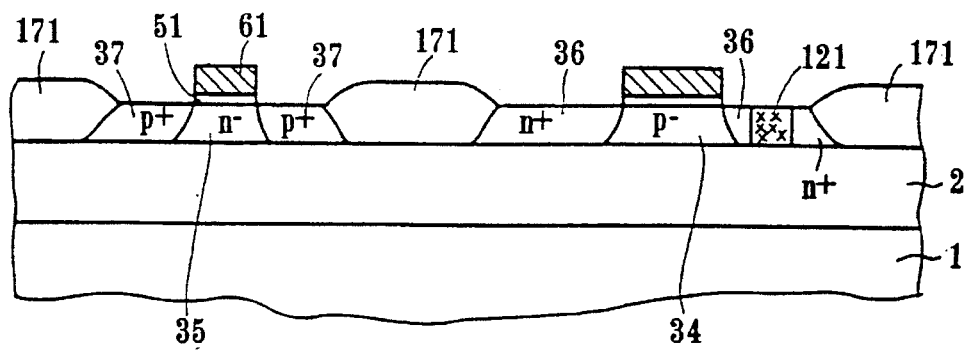
Figure 39:
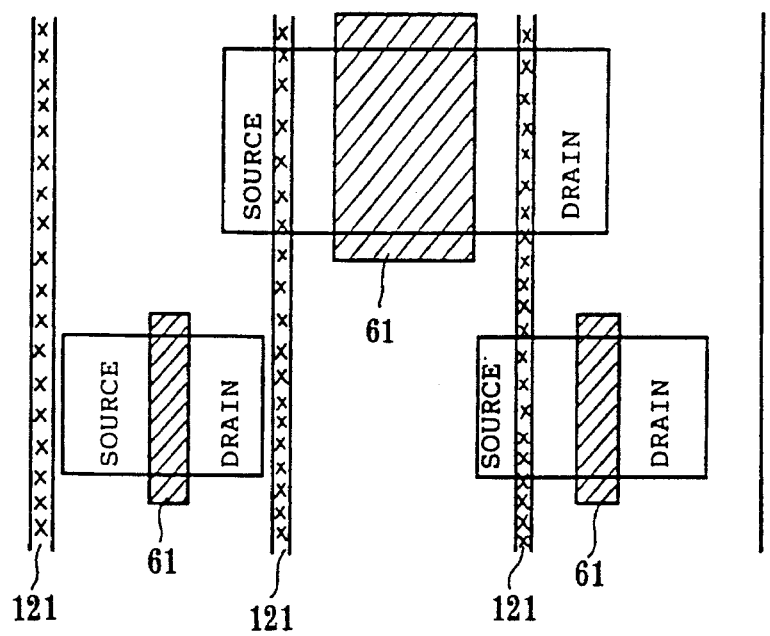

Thereafter, active devices are formed as shown in FIG. 38 in accordance with a usual process. Although FIG. 38 shows an example of transistor formation by means of LOCOS isolation, mesa isolation may be used instead of the LOCOS isolation. FIG. 39 is a top plan view showing the structure of FIG. 38 from above. As shown in FIGS. 38 and 39, the polycrystalline silicon layer 121 exists to be filled in the source or drain region of a transistor. However, if polycrystalline silicon layer 121 is disposed so that it is not formed in the channel region of the transistor, the characteristics of the device will not be given any effect. If all the element formation regions are formed from parts of monocrystal, there will be no problem at all, but even if polycrystalline silicon layer 121 exists in the part of source/drain region as shown in FIGS. 38 and 39, it is possible to form transistors with excellent characteristics by paying attention to diffusion of an impurity.

Figure 40:
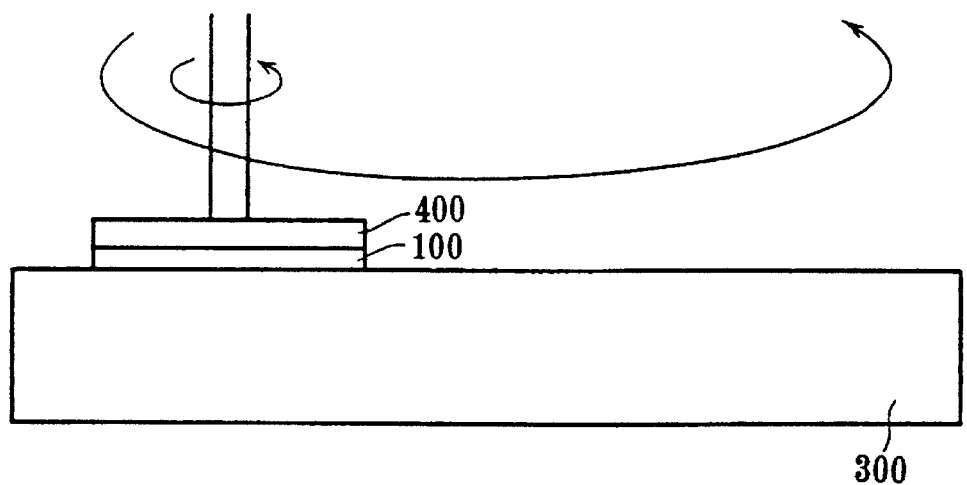
FIG. 40 is a sectional view showing the concept of a rigid polishing method used in a polishing process in a method of manufacturing a semiconductor device in accordance with the present invention.

FIG. 40 is a sectional view schematically showing a rigid polishing method used in the above-stated embodiment. In the rigid polishing method, a surface plate 300 formed of a material harder to be polished compared to silicon is used. A wafer 100 as a silicon monocrystalline substrate of an SOI structure is supported by a rotatable supporting plate 400. The surface of the monocrystalline silicon layer formed on the top of wafer 100 is polished by pressing the plane of wafer 100 to be polished to the surface plate 300 while rotating the wafer 100. In this case, colloidal silica is, for example, used as an abrasive. Silicon oxide is for example used for the surface plate. A metal may be used for the surface plate, provided that contamination to the monocrystalline semiconductor layer in polishing can be prevented. According to the rigid body polishing method shown in FIG. 40, a monocrystalline silicon layer having its surface excellently planarized can be provided using a film to be allowance for polishing which is different from the monocrystalline silicon layer in polishing speed, but it is desirable to use a material having a polishing speed equal to or close to the speed of the monocrystalline silicon layer in order to have the surface even more planarized.

Figure 41:
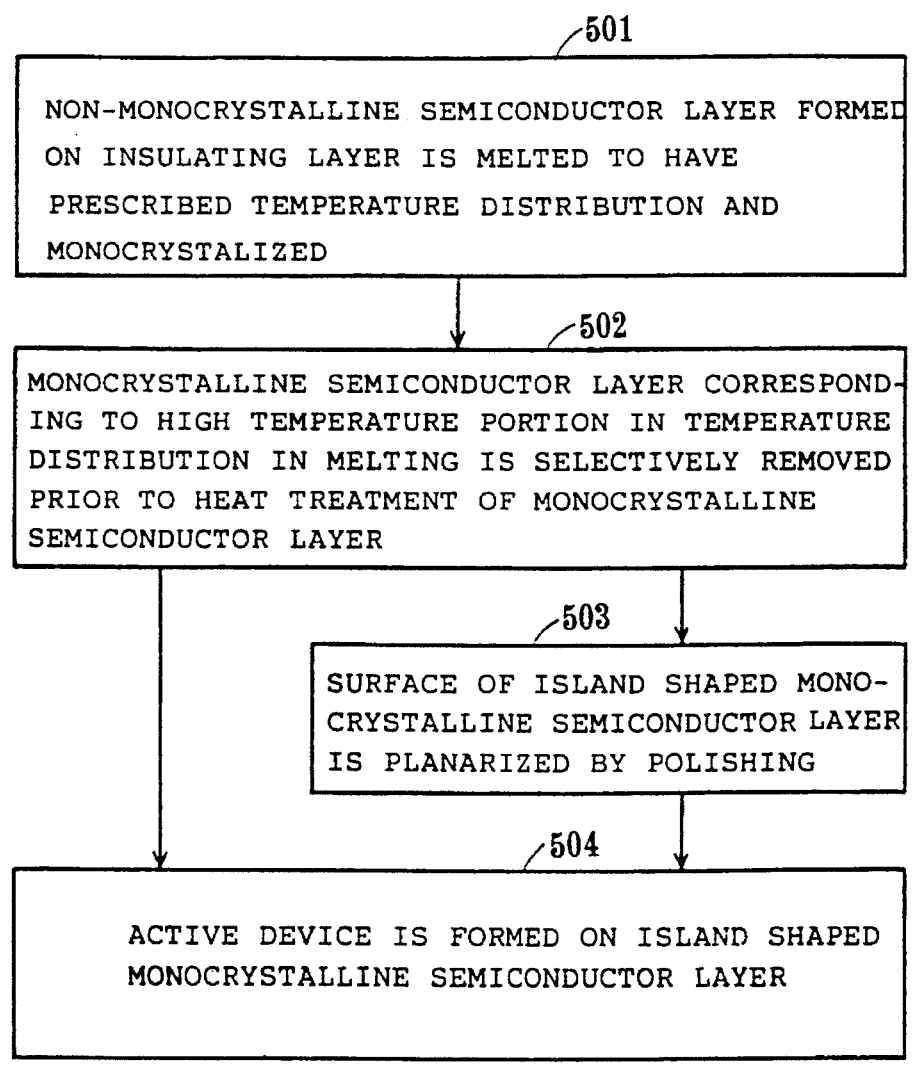
FIG. 41 is a diagram schematically showing a method of manufacturing a semiconductor device in accordance with a preset invention.
Figure 42:
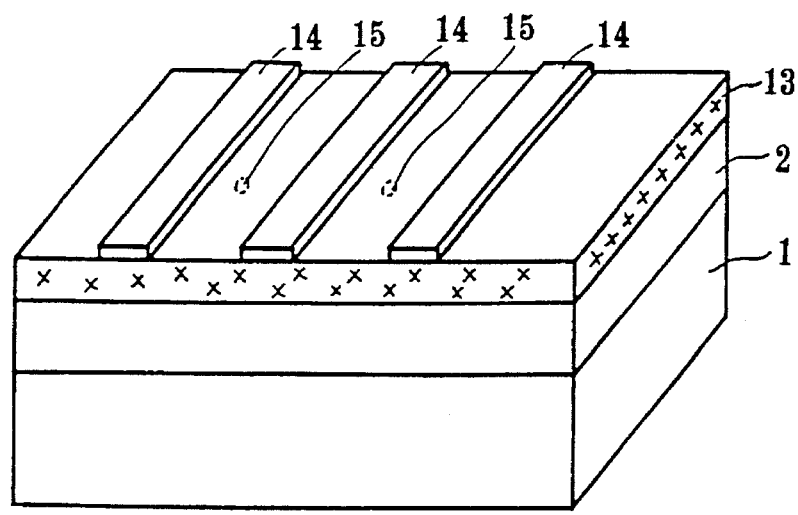
FIG. 42 is a sectional perspective view showing a typical manufacturing process in a melt recrystallization method using a conventional anti reflection film.
Figure 43:
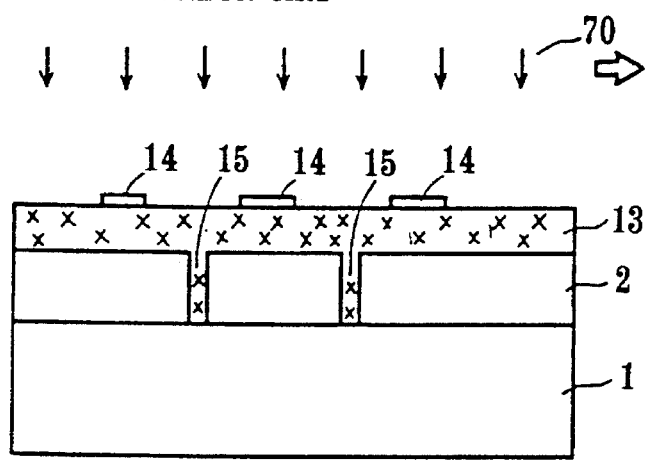
FIGS. 43–45 are sectional views sequentially showing the steps in a conventional melt recrystallization method.
Figure 44:
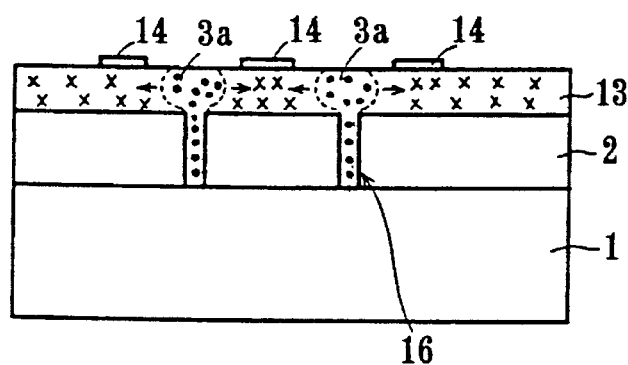
Figure 45:
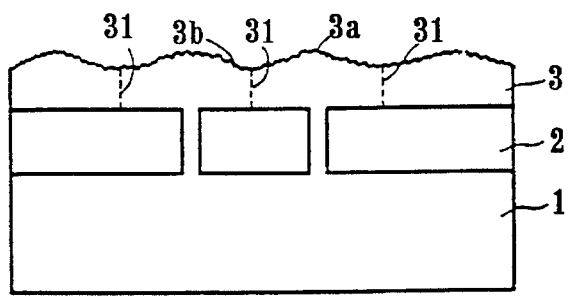
Figure 46:
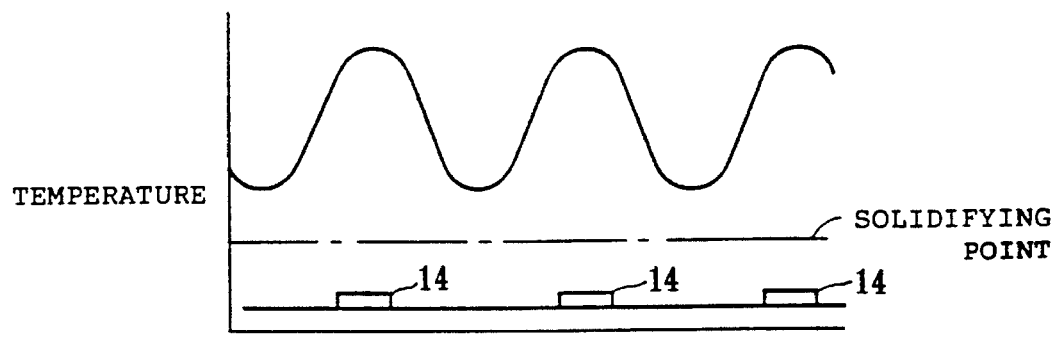
FIG. 46 is a graphic representation showing a temperature distribution in a melted polycrystalline silicon layer in a conventional melt recrystallization method.
Figure 47:
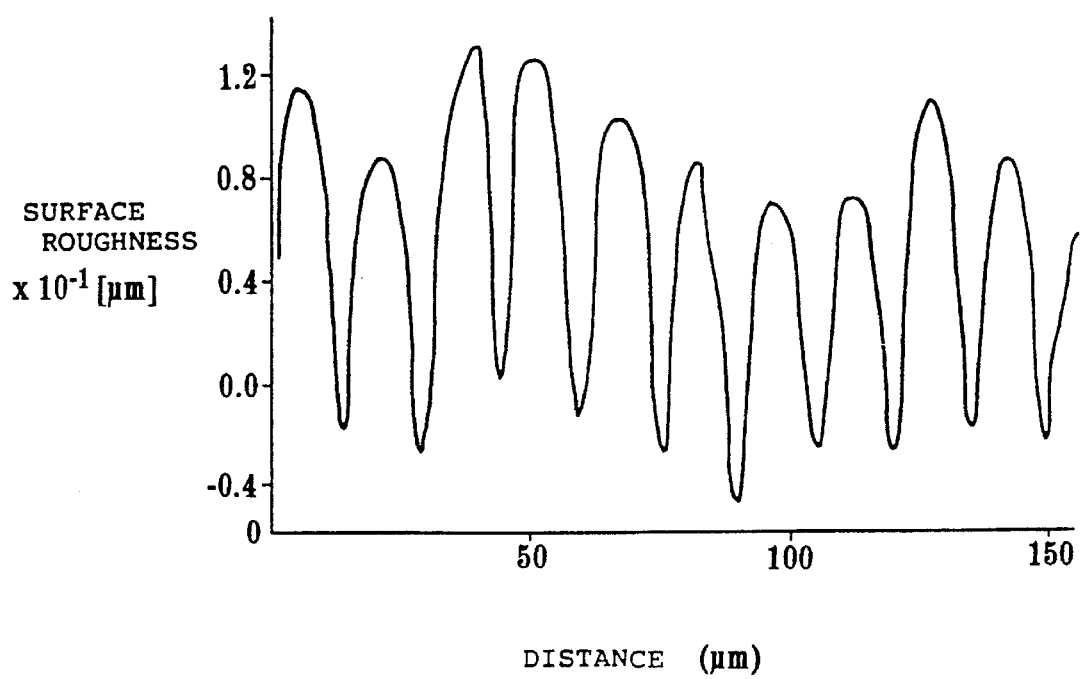
FIG. 47 is a graphic representation showing the result of measuring the surface roughness of a monocrystalline silicon layer formed by a conventional melt recrystallization method.
Figure 48:
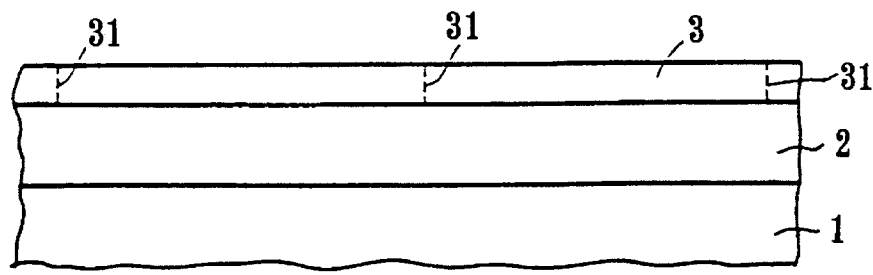
FIGS. 48–58 are sectional views sequentially showing the steps in a conventional method of manufacturing a semiconductor device.
Figure 49:
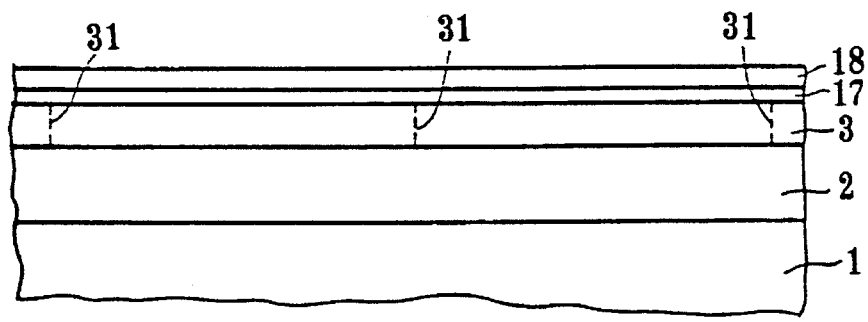
Figure 50:
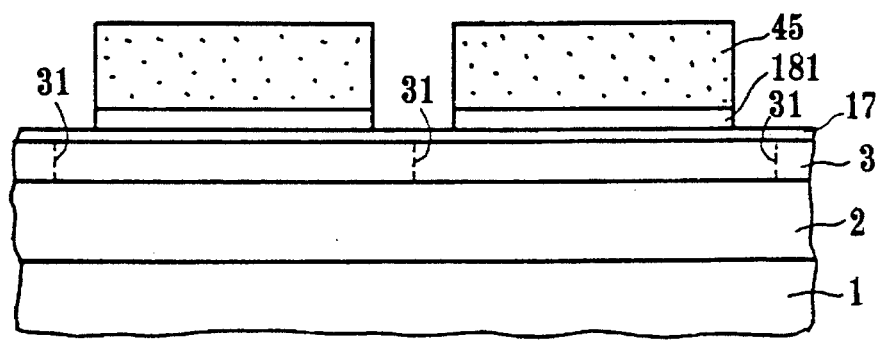
Figure 51:
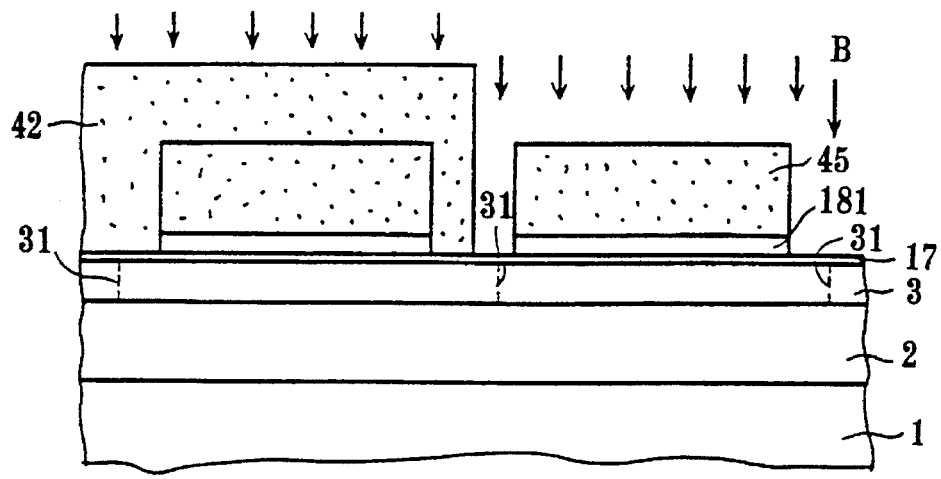

The essence of the method of manufacturing a semiconductor device in accordance with the present invention which has been described in detail by the above embodiment is summed up in the manufacturing steps schematically shown in FIG. 41. Referring to FIG. 41, a non-monocrystalline semiconductor layer formed on an insulating layer is heated, melted to give a prescribed temperature distribution, and monocrystallized (step 501). The monocrystalline semiconductor layer corresponding to the high temperature portion in the temperature distribution at the time of melting is selectively removed before the obtained monocrystalline semiconductor layer is subjected to heat-treatment (step 502). Then, active devices are formed on the resultant island shaped monocrystalline semiconductor layers (step 504). At that time, before those active devices are formed, the surface layers of the island shaped monocrystalline semiconductor layers may be polished to be removed and surfaces may be planarized for reducing the steps and recesses on the surfaces of the island monocrystalline semiconductor layers which can be responsible for uneven device properties, or for improving the device properties by reducing the thicknesses of the island shaped monocrystalline semiconductor layers (step 503).

As described above, according to the manufacturing method of the present invention, the region of the monocrystalline semiconductor layer including sub-grain boundaries or grain boundaries is previously removed, and there will be no possibility of new crystal defects being formed if oxidation treatment or heat treatment is conducted in the process of forming active devices. Thus, unevenness in the properties of the active devices or their malfunctions can be restrained significantly in a semiconductor device of an SOI structure. With the region of the monocrystalline silicon layer including grain boundaries or sub-grain boundaries being previously removed, new defects will never be formed when the monocrystalline semiconductor layer is subjected to polishing treatment for the purpose of reducing the steps and recesses in its surface. Therefore, a monocrystalline semiconductor layer having an even and flat surface can be formed on an insulating layer, and it is therefore possible to achieve higher performances by a semiconductor device of an SOI structure.

Furthermore, according to the semiconductor device of the present invention, since the transistor region is formed within the monocrystalline silicon island free of sub-grain boundaries, unevenness in the characteristics or malfunctioning of active devices can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an insulating layer;

a monocrystallized semiconductor island on the insulating layer;

an oxide layer on the semiconductor island;

a polysilicon layer on the oxide layer; and impurity ions implanted in the island to form an active region, wherein:

the monocrystallized semiconductor island is formed by depositing a non-monocrystalline semiconductor layer on the insulating layer and melting the non-monocrystalline semiconductor layer by heating using a prescribed temperature distribution throughout the non-monocrystalline semiconductor layer to convert it to a monocrystalline semiconductor layer having sub-grain boundaries, and then selectively removing only the region of the monocrystalline semiconductor layer containing the sub-grain boundaries thereby creating open spaces around the monocrystalline semiconductor island prior to thermal oxidation and prior to heat treatment thereby preventing further defects from being generated with the sub-grain boundaries as starting points resulting from oxidation or heat treatment; the oxide layer is formed by subsequent thermal oxidation; and the device is subsequently heat treated to recover defects produced by ion implantation and to activate the impurity ions.

2. A semiconductor device according to claim 1, wherein the monocrystalline semiconductor island is formed by selectively removing portions of the monocrystalline semiconductor layer corresponding to high temperature portions of the prescribed temperature distribution.

3. A device according to claim 2, wherein the semiconductor is silicon.

4. A semiconductor device according to claim 1 comprising a plurality of semiconductor islands and devices.

5. A device according to claim 4, wherein the semiconductor is silicon.

6. A semiconductor device according to claim 1, wherein the active region comprises a field effect transistor containing source and drain regions formed in the monocrystallized semiconductor island between points thereof from which sub-drain boundaries have been removed.

7. A device according to claim 6, wherein the semiconductor is silicon.

8. A device according to claim 1, wherein the semiconductor is silicon.

* * * * *